United States Patent
Siciliani et al.

(10) Patent No.: US 12,340,851 B2
(45) Date of Patent: Jun. 24, 2025

(54) MEMORIES FOR PERFORMING SUCCESSIVE PROGRAMMING OPERATIONS

(71) Applicant: MICRON TECHNOLOGY, INC., Boise, ID (US)

(72) Inventors: Umberto Siciliani, Rubano (IT); Violante Moschiano, Avezzano (IT); Walter Di Francesco, Silvi (IT); Dheeraj Srinivasan, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 18/110,489

(22) Filed: Feb. 16, 2023

(65) Prior Publication Data

US 2023/0298680 A1    Sep. 21, 2023

Related U.S. Application Data

(60) Provisional application No. 63/320,367, filed on Mar. 16, 2022.

(51) Int. Cl.
| | | |
|---|---|---|
| G11C 16/04 | (2006.01) | |
| G11C 16/10 | (2006.01) | |
| G11C 16/20 | (2006.01) | |
| G11C 16/34 | (2006.01) | |

(52) U.S. Cl.
CPC ........ G11C 16/3459 (2013.01); G11C 16/102 (2013.01); G11C 16/20 (2013.01)

(58) Field of Classification Search
CPC ... G11C 16/3459; G11C 16/102; G11C 16/20; G11C 16/0483; G11C 16/08; G11C 16/32; G11C 16/10; G06F 13/00
USPC .................................................. 365/185.22
See application file for complete search history.

(56) References Cited

U.S. PATENT DOCUMENTS

| | | | |
|---|---|---|---|
| 9,430,417 B2 | 8/2016 | Tanzawa | |
| 9,767,894 B2 | 9/2017 | Tang et al. | |
| 10,304,549 B2 * | 5/2019 | Lee | G11C 16/3418 |
| 10,839,927 B1 | 11/2020 | Cantarelli et al. | |
| 10,922,017 B2 | 2/2021 | Patel et al. | |
| 11,069,403 B2 * | 7/2021 | Shirakawa | G11C 11/5642 |

OTHER PUBLICATIONS

Lee, et al., "Memory Devices for Multiple Read Operations", U.S. Appl. No. 17/463,789, filed Sep. 1, 2021, Total pp. 52.

* cited by examiner

*Primary Examiner* — Tha-O H Bui
(74) *Attorney, Agent, or Firm* — Dicke, Billig & Czaja, PLLC

(57) ABSTRACT

Memories might include a controller configured to cause the memory to prepare a first plurality of memory cells of a block of memory cells for programming from an initialization state of the block of memory cells, program the first data to the first plurality of memory cells, and, in response to receiving a write command associated with a second address corresponding to the block of memory cells and with second data before successfully verifying programming of the first data to the first plurality of memory cells, prepare a second plurality of memory cells of the block of memory cells corresponding to the second address for programming without returning the block of memory cells to the initialization state after programming the first data to the first plurality of memory cells.

22 Claims, 18 Drawing Sheets

MEMORIES FOR PERFORMING SUCCESSIVE PROGRAMMING OPERATIONS

RELATED APPLICATION

This application claims the benefit of U.S. Provisional Application No. 63/320,367, filed on Mar. 16, 2022, hereby incorporated herein in its entirety by reference.

TECHNICAL FIELD

The present disclosure relates generally to memory and, in particular, in one or more embodiments, the present disclosure relates to apparatus and methods for performing successive array operations in a memory.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC might use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

DETAILED DESCRIPTION

Figure 1A:
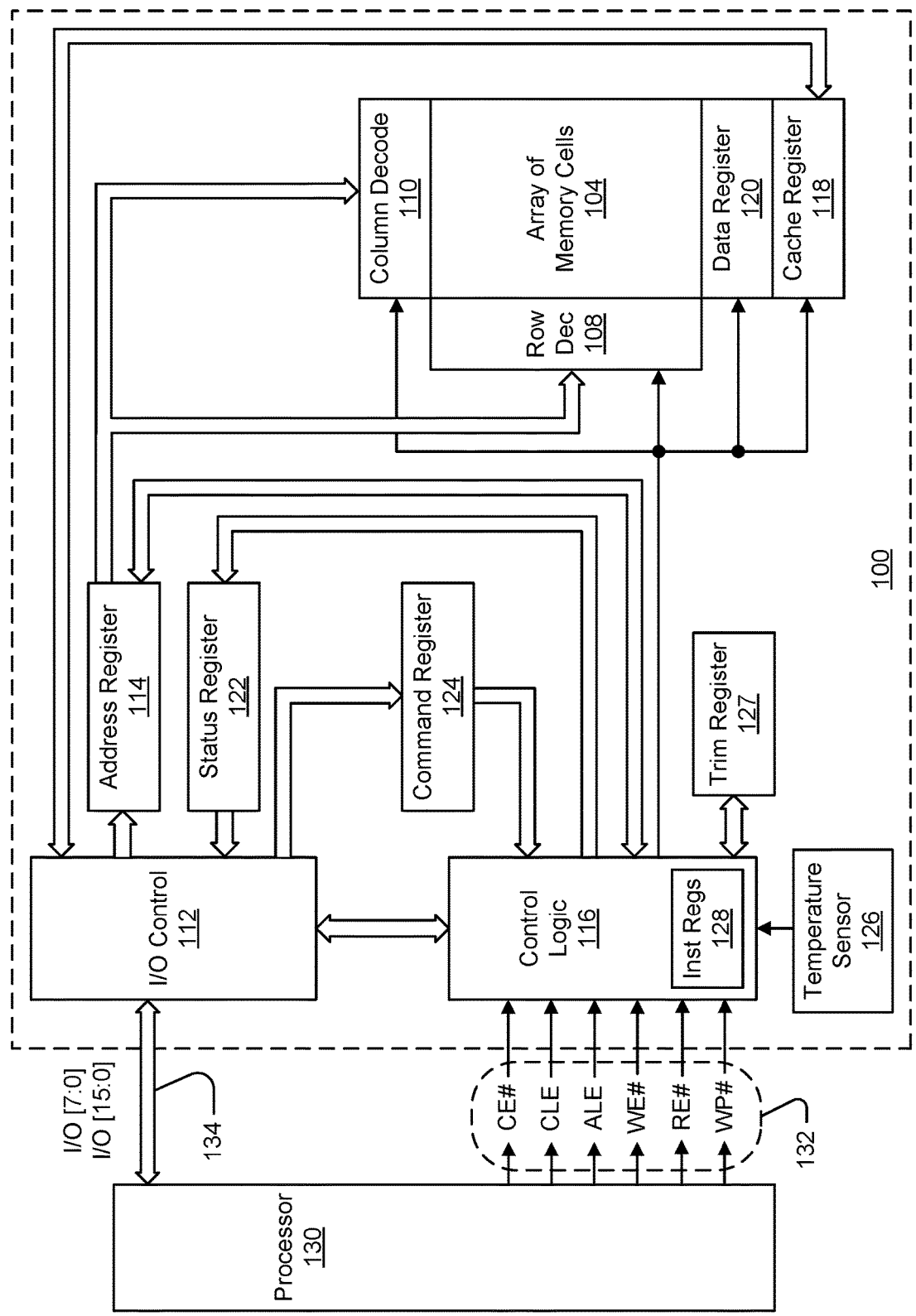
FIG. 1A is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by an electrically conductive path unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

Programming speed and power efficiency are often important considerations in the design and usage of integrated circuit devices, e.g., semiconductor memories. Various embodiments might facilitate improved programming speeds in such a memory, and might further facilitate power savings in conjunction with improved programming speeds. In particular, various embodiments might abbreviate and/or omit certain phases of a programming operation in response to receipt of a subsequent command, e.g., for another programming operation to a same block of memory cells. By abbreviating and/or omitting one or more phases of a programming operation, increases in programming speed and power savings might be attained.

FIG. 1A is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1A) of at least a portion of array of memory cells 104 are capable of being programmed to one of at least two target data states.

Row decode circuitry 108 and column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112, and with row decode circuitry 108 and column decode circuitry 110, to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and might generate status information for the external processor 130, i.e., control logic 116 is configured to perform array operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104, then new data might be latched in the cache register 118 from the I/O control circuitry 112. During a read operation, data might be passed from the cache register 118 to the I/O control circuitry 112 for output to the external processor 130, then new data might be passed from the data register 120 to the cache register 118. The cache register 118 and/or the data register 120 might form (e.g., might form a portion of) a page buffer of the memory device 100. A data register 120 might further include sense circuits (not shown in FIG. 1A) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

The control logic 116 might further be in communication with temperature sensor 126. Temperature sensor 126 might sense a temperature of the memory device 100 and provide an indication to the control logic 116 representative of that temperature, such as some voltage, resistance level, digital representation, etc. Some examples of a temperature sensor 126 might include a thermocouple, a resistive device, a thermistor or an infrared sensor. Alternatively, temperature sensor 126 might be external to memory device 100 and in communication with the external processor 130. In this configuration, temperature sensor 126 might provide an indication of ambient temperature rather than device temperature. Processor 130 could communicate the indication representative of the temperature to the control logic 116, such as across input/output (I/O) bus 134 as a digital representation.

A trim register 127 might be in communication with the control logic 116. The trim register 127 might represent a volatile memory, latches, or other storage location, e.g., volatile or non-volatile. For some embodiments, the trim register 127 might represent a portion of the array of memory cells 104. Trims might be used by the memory to set values used by an array operation, e.g., voltage levels, timing characteristics, etc., or might be used to selectively activate or deactivate features of the memory.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1A has been simplified. It should be recognized that the functionality of the various block components described with reference to FIG. 1A might not necessarily be segregated to distinct components or component portions of an integrated circuit device. For example, a single component or component portion of an integrated circuit device could be adapted to perform the functionality of more than one block component of FIG. 1A. Alternatively, one or more components or component portions of an integrated circuit device could be combined to perform the functionality of a single block component of FIG. 1A.

Additionally, while specific I/O pins are described in accordance with popular conventions for receipt and output of the various signals, it is noted that other combinations or numbers of I/O pins (or other I/O node structures) might be used in the various embodiments.

Figure 1B:
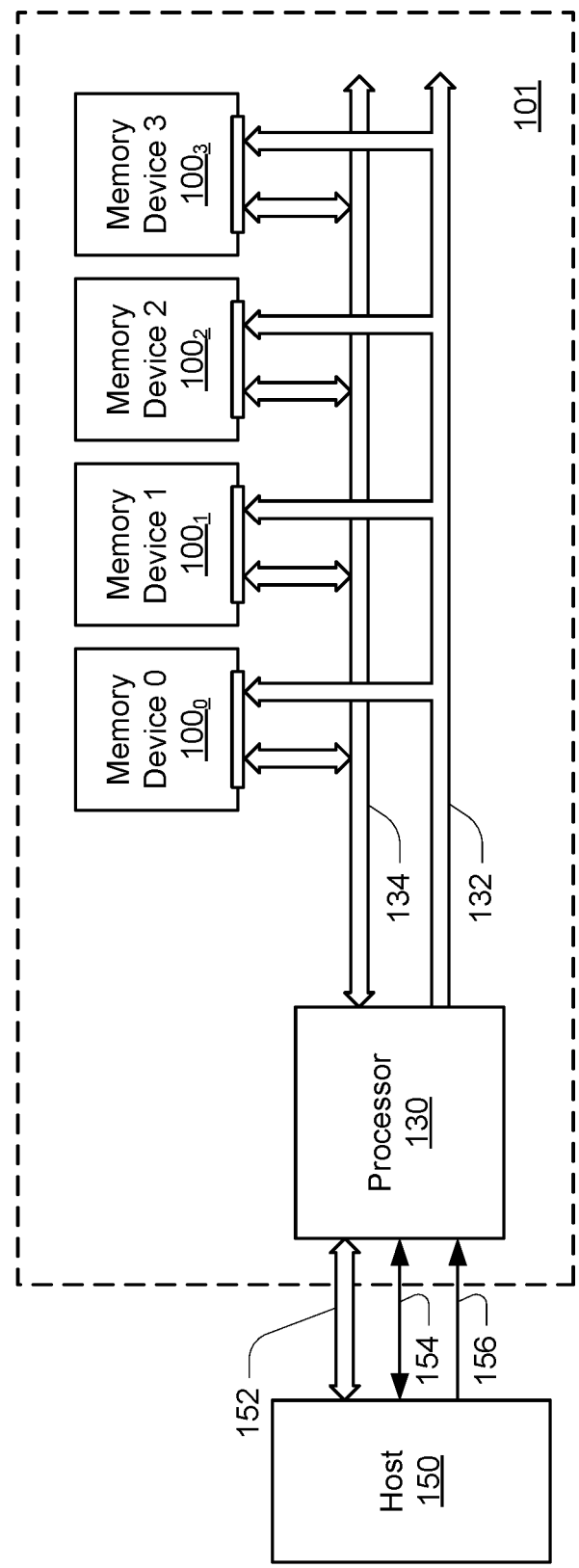
FIG. 1B is a simplified block diagram of an apparatus in the form of a memory module in communication with a host as part of an electronic system, according to another embodiment.

A given processor 130 might be in communication with one or more memory devices 100, e.g., dies. FIG. 1B is a simplified block diagram of an apparatus in the form of a memory module 101 in communication with a host 150 as part of an electronic system, according to another embodiment. Memory devices 100 (e.g., memories 1000-1003), processor 130, control link 132, and I/O bus 134 may be as described with reference to FIG. 1A. Although memory module (e.g., memory package) 101 of FIG. 1B is depicted with four memory devices 100 (e.g., dies), memory module 101 could have some other number of one or more memory devices 100.

Because processor 130 (e.g., a memory controller) is between the host 150 and the memory devices 100, communication between the host 150 and the processor 130 might involve different communication links than those used between the processor 130 and the memory devices 100. For example, the memory module 101 might be an Embedded MultiMediaCard (eMMC) of a solid state drive (SSD). In accordance with existing standards, communication with an eMMC might include a data link 152 for transfer of data (e.g., an 8-bit link), a command link 154 for transfer of commands and device initialization, and a clock link 156 providing a clock signal for synchronizing the transfers on the data link 152 and command link 154. The processor 130 might handle many activities autonomously, such as power-loss detection, error correction, management of defective blocks, wear leveling, and address translation.

Figure 2A:
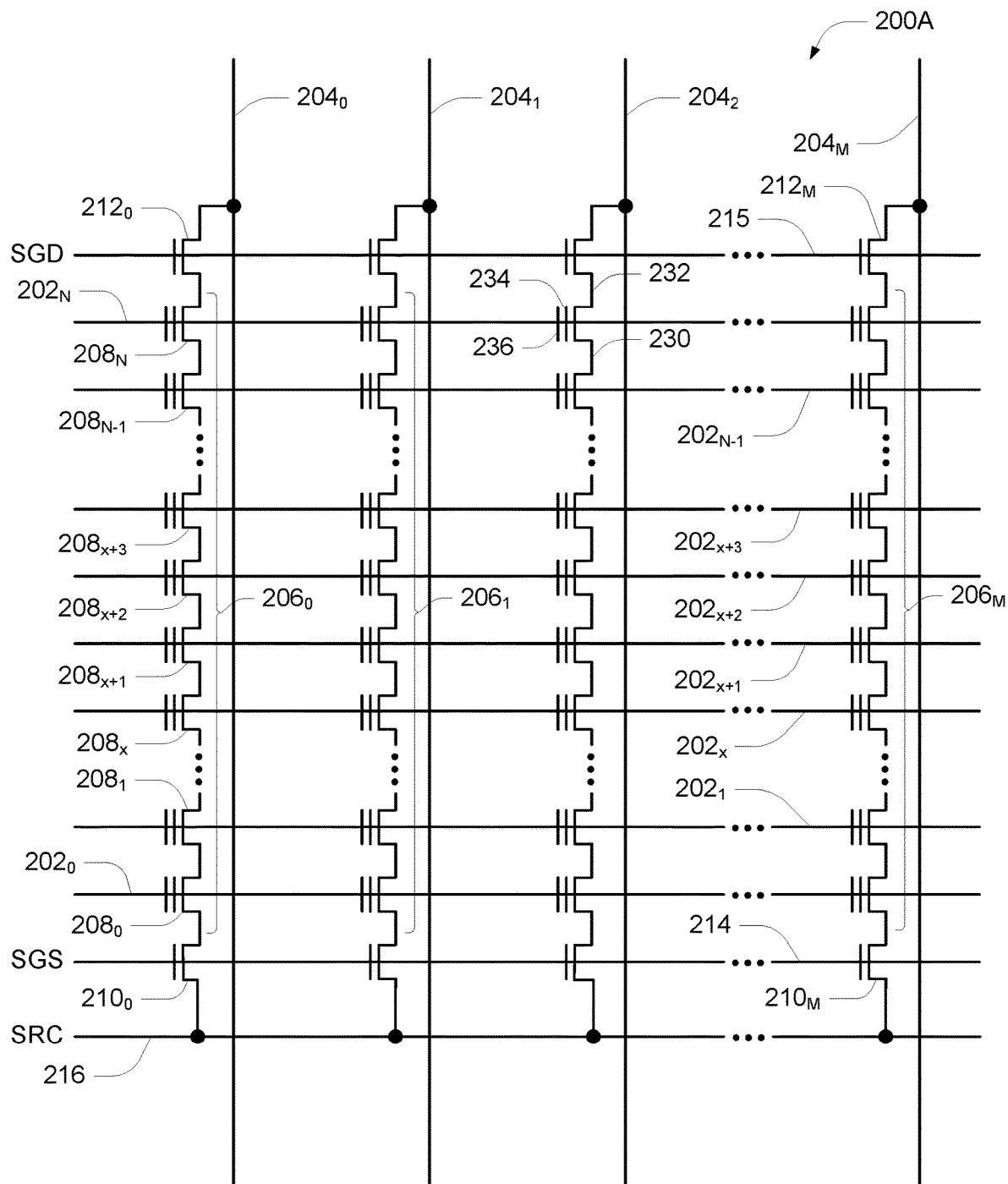
FIGS. 2A-2C are schematics of portions of an array of memory cells as could be used in a memory of the type described with reference to FIG. 1A.

FIG. 2A is a schematic of a portion of an array of memory cells 200A, such as a NAND memory array, as could be used in a memory of the type described with reference to FIG. 1A, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
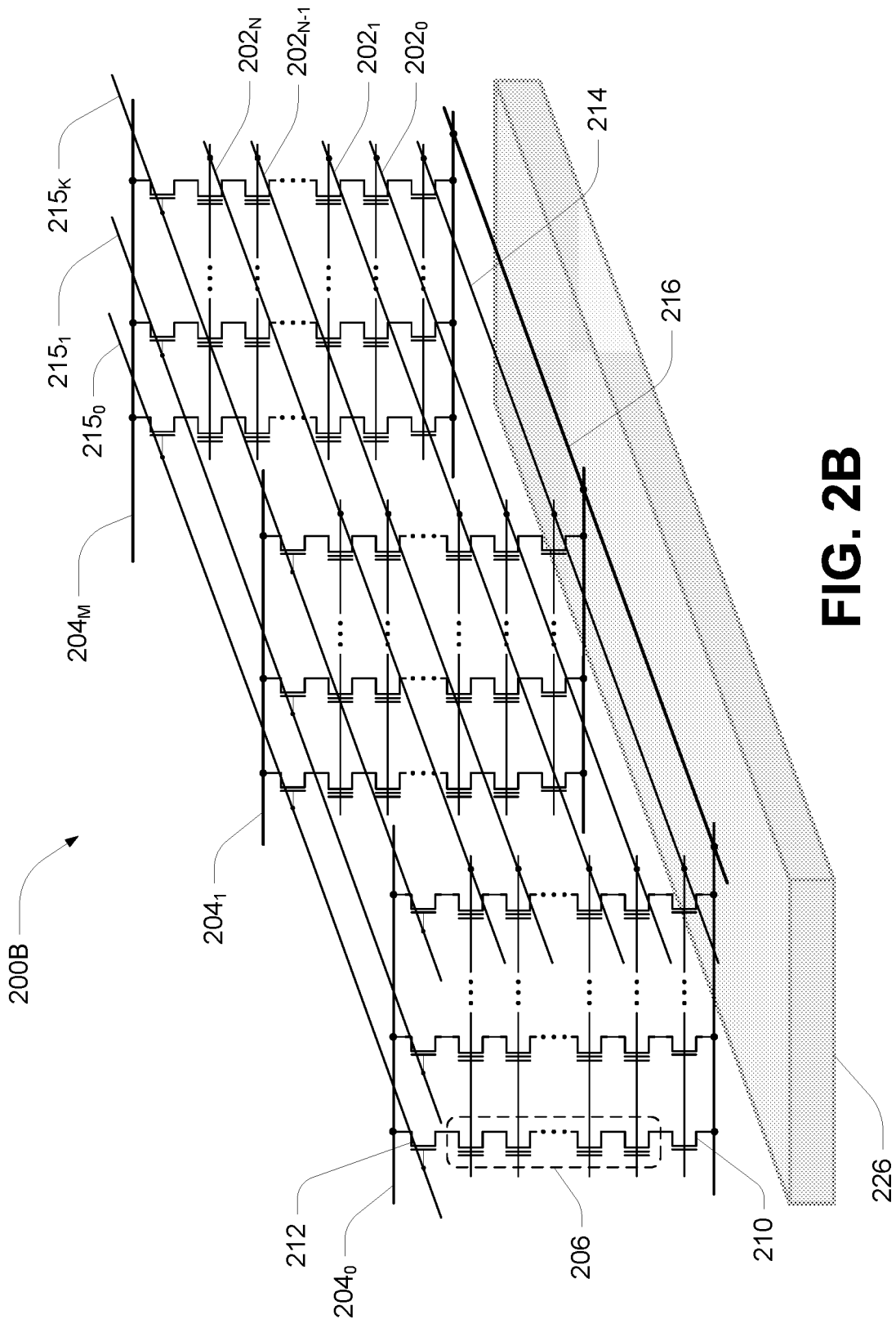

FIG. 2B is another schematic of a portion of an array of memory cells 200B as could be used in a memory of the type described with reference to FIG. 1A, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars, which might be solid or hollow, where a portion of a pillar might act as a channel region of the memory cells of NAND strings 206, e.g., a region through which current might flow when a memory cell, e.g., a field-effect transistor, is activated. The NAND strings 206 might be each selectively connected to a data line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$-$215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel region and p-channel region transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
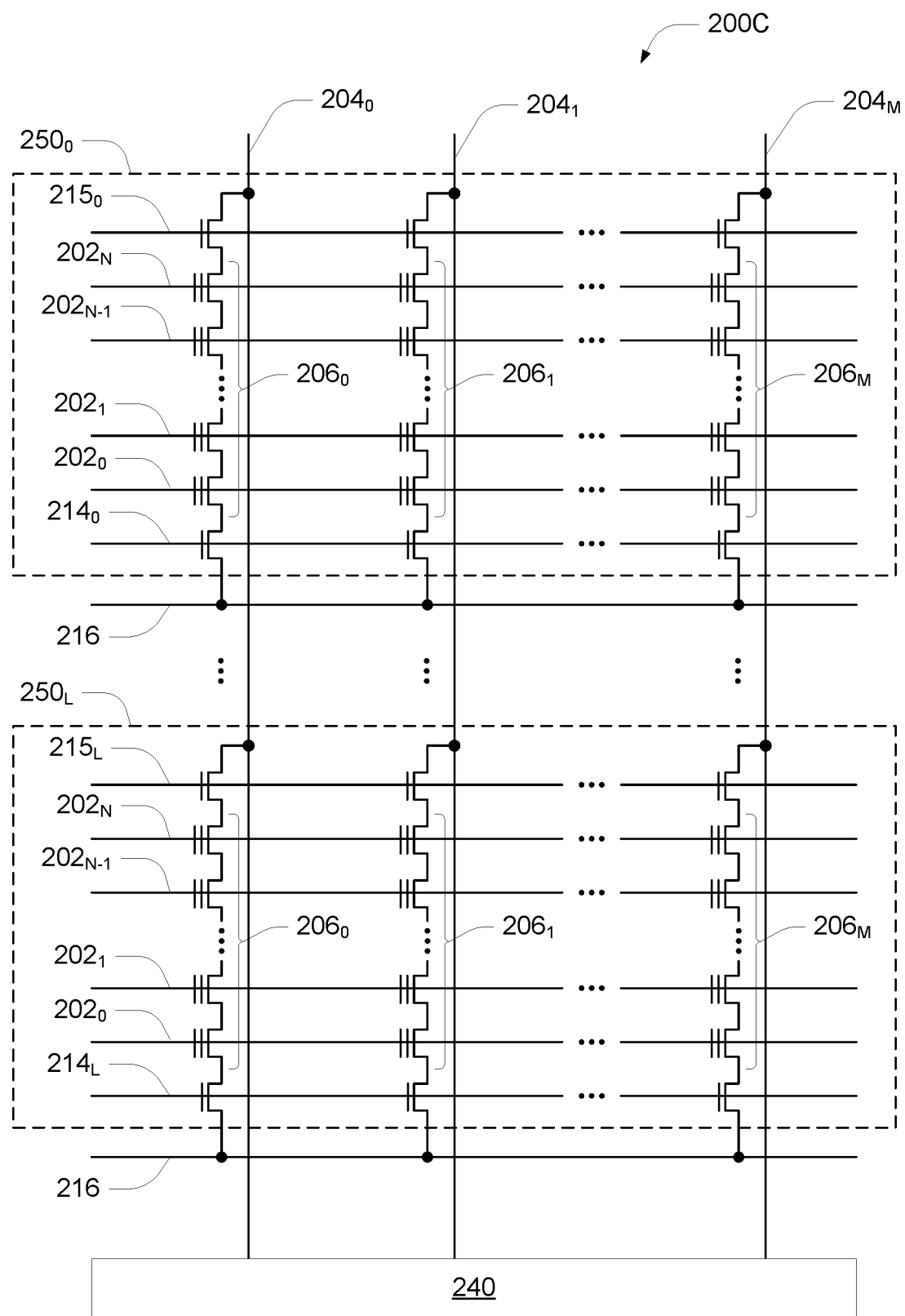

FIG. 2C is a further schematic of a portion of an array of memory cells 200C as could be used in a memory of the type described with reference to FIG. 1A, e.g., as a portion of array of memory cells 104. Like numbered elements in FIG. 2C correspond to the description as provided with respect to FIG. 2A. Array of memory cells 200C might include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A might be a portion of the array of memory cells 200C, for example. FIG. 2C depicts groupings of NAND strings 206 into blocks of memory cells 250, e.g., blocks of memory cells $250_0$-$250_L$. Blocks of memory cells 250 might be groupings of memory cells 208 that might be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 might have no direct connection to access lines 202 and select lines 214 and 215, respectively, of any other block of memory cells 250 of the blocks of memory cells $250_0$-$250_L$.

The data lines $204_0$-$204_M$ might be connected (e.g., selectively connected) to a buffer portion 240, which might be a portion of a page buffer of the memory. The buffer portion 240 might correspond to a memory plane (e.g., the set of blocks of memory cells $250_0$-$250_L$). The buffer portion 240 might include sense circuits (not shown in FIG. 2C) for sensing data values indicated on respective data lines 204. The buffer portion 240 might include a portion of the data register 120 and a portion of the cache register 118 corresponding to the blocks of memory cells $250_0$-$250_L$.

Figure 3:
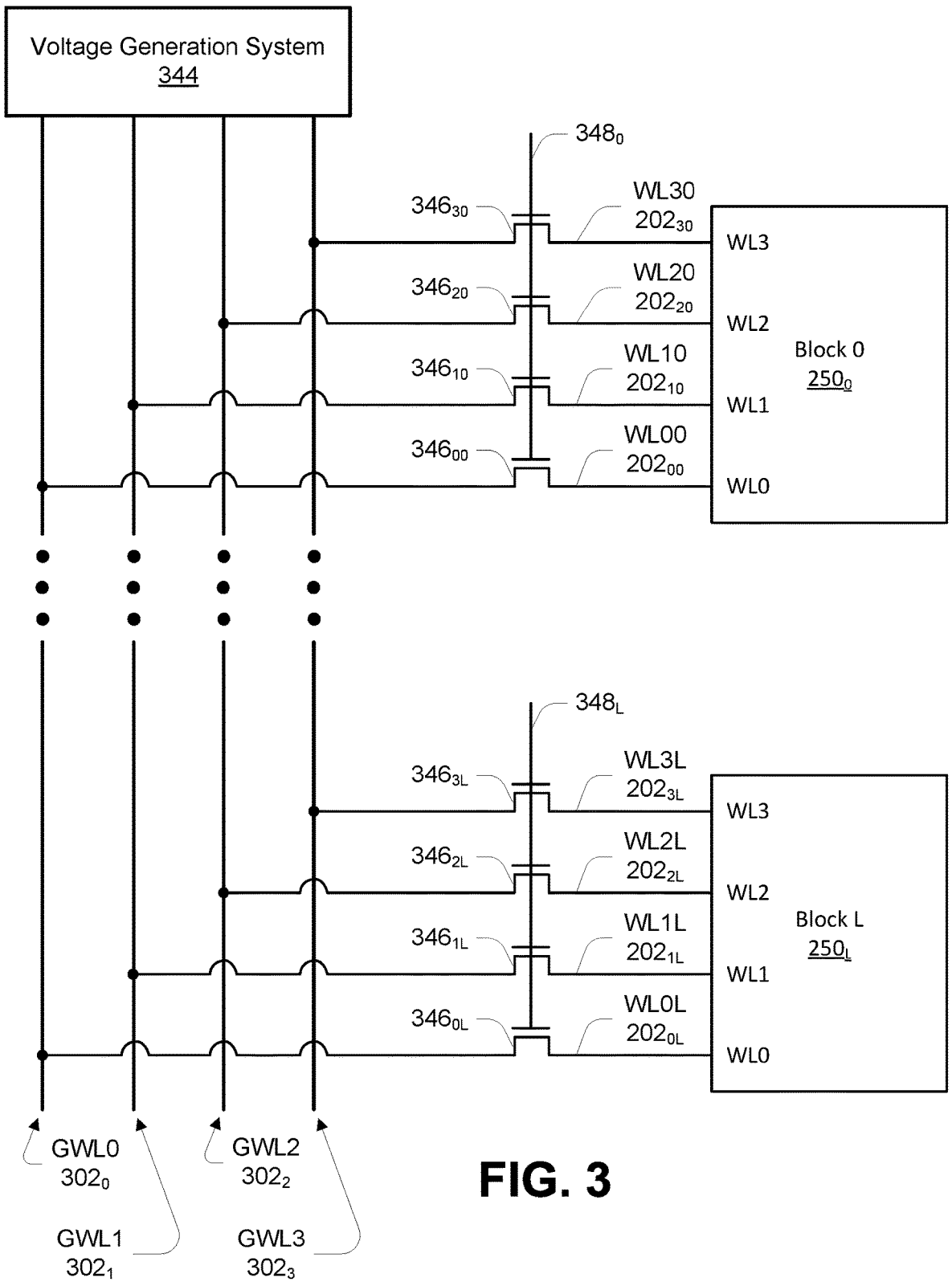
FIG. 3 is a block schematic of a portion of an array of memory cells and block select circuitry as could be used in a memory of the type described with reference to FIG. 1A.

FIG. 3 is a schematic of a portion of an array of memory cells and block select circuitry as could be used in a memory of the type described with reference to FIG. 1A and depicting a many-to-one relationship between local access lines (e.g., local word lines) 202 and global access lines (e.g., global word lines) 302.

As depicted in FIG. 3, a plurality of blocks of memory cells 250 might have their local access lines (e.g., local word lines) 202 commonly selectively connected to a plurality of global access lines (e.g., global word lines) 302. For simplicity, drain select lines and source select lines, and their corresponding transistors, are not depicted. Although FIG. 3 depicts only blocks of memory cells $250_0$ and $250_L$ (Block 0 and Block L), additional blocks of memory cells 250 might have their local access lines 202 commonly connected to global access lines 302 in a like manner. Similarly, although FIG. 3 depicts only four local access lines 202 for each block of memory cells, blocks of memory cells 250 might include fewer or more local access lines 202 (and might be associated with fewer or more global access lines 302 in a like manner). The blocks of memory cells $250_0$-$250_L$ might belong to a single plane of memory cells, e.g., a grouping of blocks of memory cells 250 commonly associated with a single buffer portion 240.

To facilitate memory array operations to specific blocks of memory cells 250 commonly coupled to a given set of global access lines 302, each block of memory cells 250 might have a corresponding set of block select transistors 346 in a one-to-one relationship with their local access lines 202. Control gates of the set of block select transistors 346 for a given block of memory cells 250 might be commonly connected to a corresponding block select line 348. For example, for block of memory cells $250_0$, local access line $202_{00}$ might be selectively connected to global access line $302_0$ through block select transistor $346_{00}$, local access line $202_{10}$ might be selectively connected to global access line $302_1$ through block select transistor $346_{10}$, local access line $202_{20}$ might be selectively connected to global access line $302_2$ through block select transistor $346_{20}$, and local access line $202_{30}$ might be selectively connected to global access line $302_3$ through block select transistor $346_{30}$, while block select transistors $346_{00}$-$346_{30}$ are responsive to a control signal received on block select line $348_0$. The block select transistors 346 for a block of memory cells 250 might collectively be referred to as block select circuitry, and such block select circuitry for a block of memory cells 250 is commonly referred to as a string driver. Such block select circuitry might be formed in the peripheral circuitry 226, for example. Each block select transistor 346 might represent a selective connection of a local access line 202 to its respective global access line 302. A voltage generation system 344 might be connected (e.g., selectively connected) to each global access line 302 to apply respective voltage levels to each global access line 302 for performing array operations.

Figure 4:
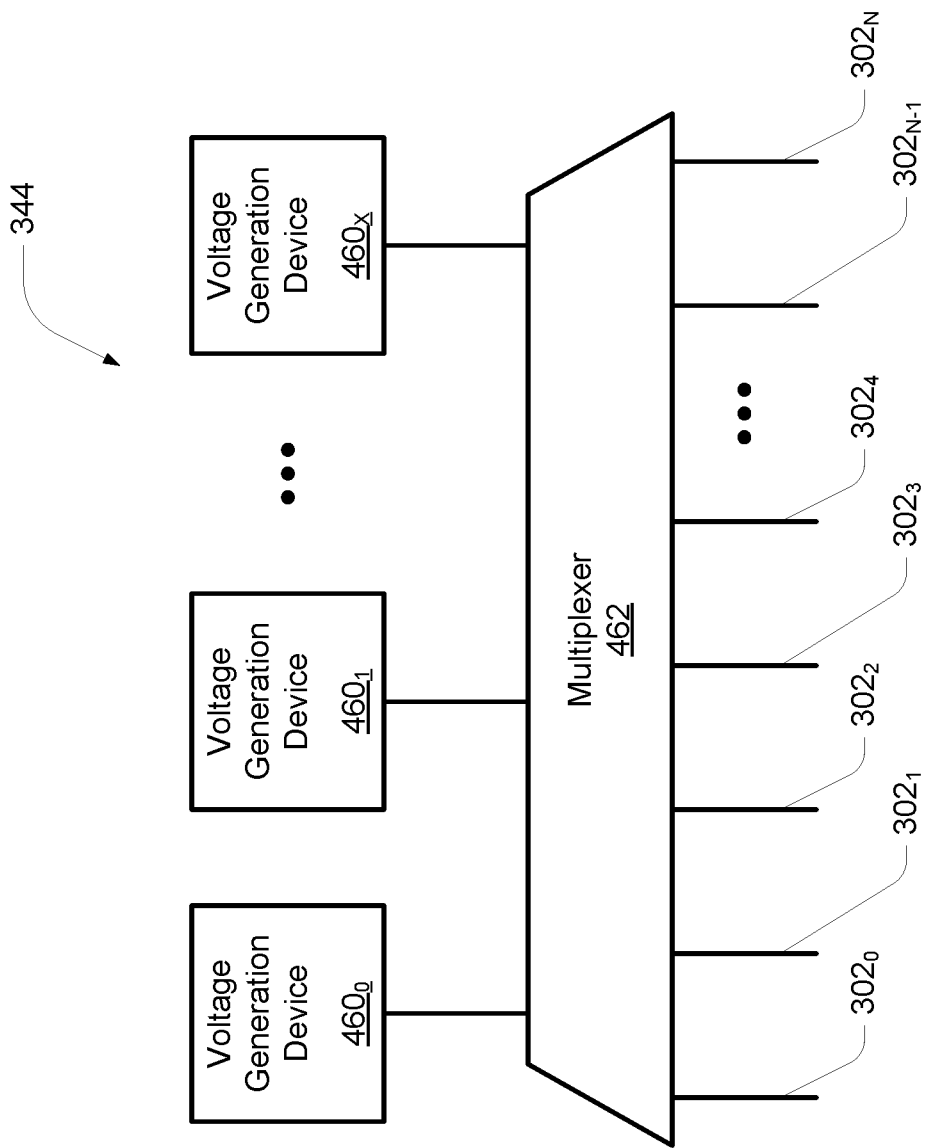
FIG. 4 is a block schematic of a voltage generation system as could be used in a memory of the type described with reference to FIG. 1A.

FIG. 4 is a block schematic of a voltage generation system 344 as could be used in a memory of the type described with reference to FIG. 1A. As depicted, the voltage generation system 344 might include a number of voltage generation devices 460, e.g., voltage generation devices $460_0$-$460_X$. For example, each voltage generation device 460 might represent a charge pump.

Each voltage generation device 460 might be selectively connected to a respective one or more of the global access lines 302 (e.g., global access lines $302_0$-$302_N$). Each voltage generation device 460 might be configured to generate one or more voltage levels to be applied to its respective one or more global access lines 302, and the local access lines 202 connected thereto, during an array operation. For example, during a programming operation, the voltage generation device $460_0$ might be configured to generate a programming voltage to be applied to a local access line 202 connected to a memory cell 208 selected for programming, while the voltage generation device $460_1$ might be configured to generate a pass voltage to be applied to local access lines 202 connected to other memory cells 208 in a same NAND string 206 as the selected memory cell 208. The applied voltage level might vary during the array operation. For example, a selected access line receiving a programming voltage might first be brought to the pass voltage, and subsequently raised to the programming voltage. Programming operations using more than one pass voltage level, and/or further using one or more isolation voltage levels, are known, and additional voltage generation devices 460 could be used to generate such additional voltage levels to be applied to their respective global access lines 302.

Figure 5:
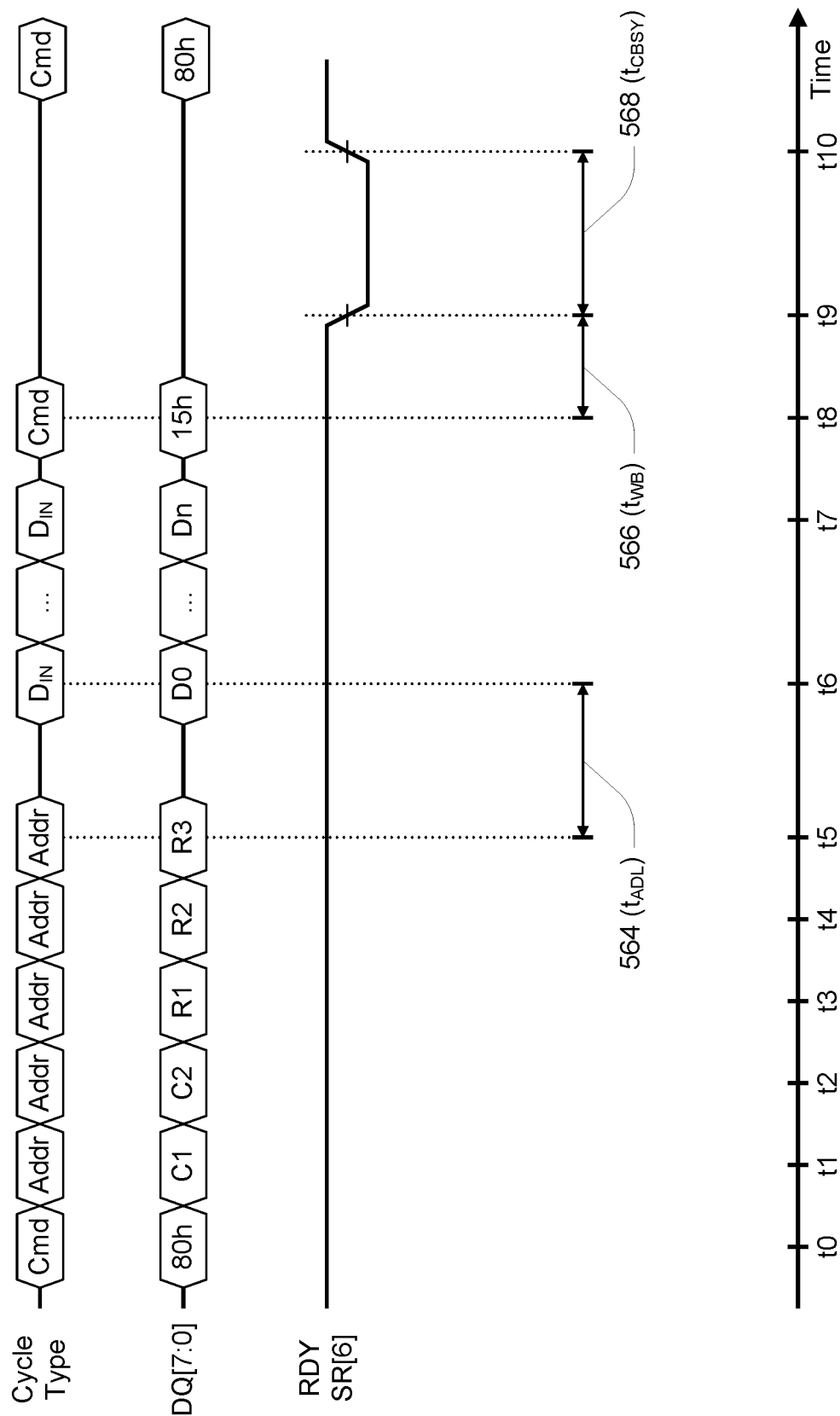
FIG. 5 is a timing diagram for an array operation in accordance with an embodiment.

FIG. 5 is a timing diagram for an array operation in accordance with an embodiment. In the example of FIG. 5, the array operation might represent a programming operation, e.g., a cache programming operation. At time t0, a first cycle of a command (e.g., write command) might be received by a controller of the memory, e.g., the control logic 116. The first cycle of the command might be received from a command queue. In the example of FIG. 5, the first cycle of the command is illustrated as 80 h. However, the particular command code is provided by way of example, and is, therefore, not to be taken in a limiting sense. At times t1 and t2, a column address might be received by the controller of the memory, e.g., a first packet C1 of the column address at time t1 and a second packet C2 of the column address at time t2. The column address might identify target columns of the array of memory cells for the programming operation. At times t3-t5, a row address might be received by the controller of the memory, e.g., a first packet R1 of the row address at time t3, a second packet R2 of the row address at time t4, and a third packet R3 of the row address at time t5. The row address might identify a target row of the array of memory cells for the programming operation, and, in conjunction with the column address, might identify a target block of memory cells for the programming operation. It is recognized that while two packets of the column address and three packets of the row address are depicted in FIG. 5, the size of the column and row addresses will depend on the addressable space of the memory, such that fewer or more address packets might be utilized as appropriate. From time t6 to time t7, one or more packets of data might be received by the memory. The data packets might be delayed after receiving the last address packet by an Address Cycle to Data Loading time ($t_{ADL}$) 564. At time t8, a second cycle of the command might be received by the controller of the memory. In the example of FIG. 5, the second cycle of the command is illustrated as 15 h. However, the particular command code is provided by way of example, and is, therefore, not to be taken in a limiting sense. The data packets might be loaded into the cache register 118 for subsequent transfer to the data register 120.

A period of time after the command is complete, e.g., after the first and second cycles of the command are received by the controller of the memory in this example, and before the memory transitions the RDY status indicator (e.g., status register 6, or SR[6]), might correspond to a period of time for loading the cache register 118 or for other preparatory activities prior to programming of the data to the array of memory cells. For the example command, this might be referred to as $t_{WB}$. The time $t_{WB}$ 566 might correspond to the period of time from time t8 to time t9.

At time t9, the memory might indicate that the cache register 118 is busy, e.g., contains valid data and cannot be loaded with new data, and might complete transfer of its data to the data register 120 at time t10. The period of time from time t9 to time t10 corresponding to the example command might be referred to as a cache busy time ($t_{CBSY}$) 568. At time t10, following completion of time $t_{CBSY}$ 568, the memory might transition its RDY status indicator to its initial value, thus indicating that the controller is available to accept a command for a next array operation. A first cycle of a next command might then be received by the controller of the memory.

Figure 6:
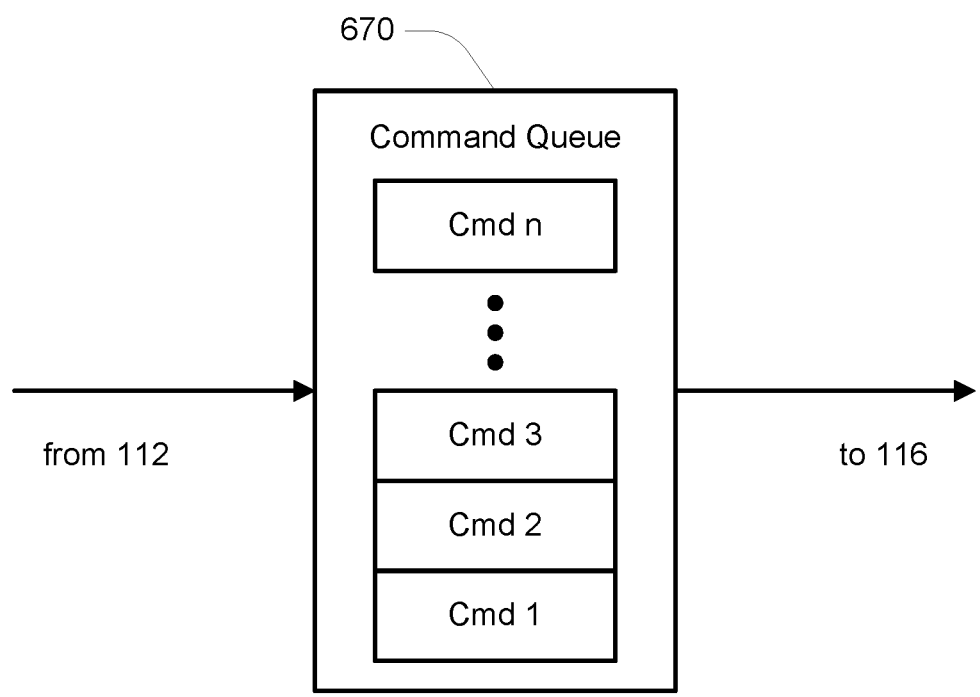
FIG. 6 is a block diagram of a command queue as could be used in a memory of the type described with reference to FIG. 1A.

Commands received by the memory might be queued prior to being received by the controller of the memory. FIG. 6 is a block diagram of a command queue 670 as could be used in a memory of the type described with reference to FIG. 1A. The command queue 670 might be a portion of the command register 124 and/or the address register 114. The command queue 670 might receive commands, along with their associated addresses and/or data as appropriate, from the I/O control circuitry 112, and may provide them to the control circuitry 116 when the control circuitry 116 is ready for processing. The command queue 670 might represent a first-in-first-out queue corresponding to a portion of (e.g., only a portion of) the array of memory cells 104. For example, the command queue 670 might queue commands for access of a particular set of blocks of memory cells 250, e.g., a memory plane. The memory might further include one or more additional command queues 670 for queueing commands for access of different portions of the array of memory cells 104, e.g., different memory planes. The control circuitry 116 might be in communication with the command queue 670, and might have knowledge of the next command for access of its corresponding portion of the array of memory cells 104.

Figure 7:
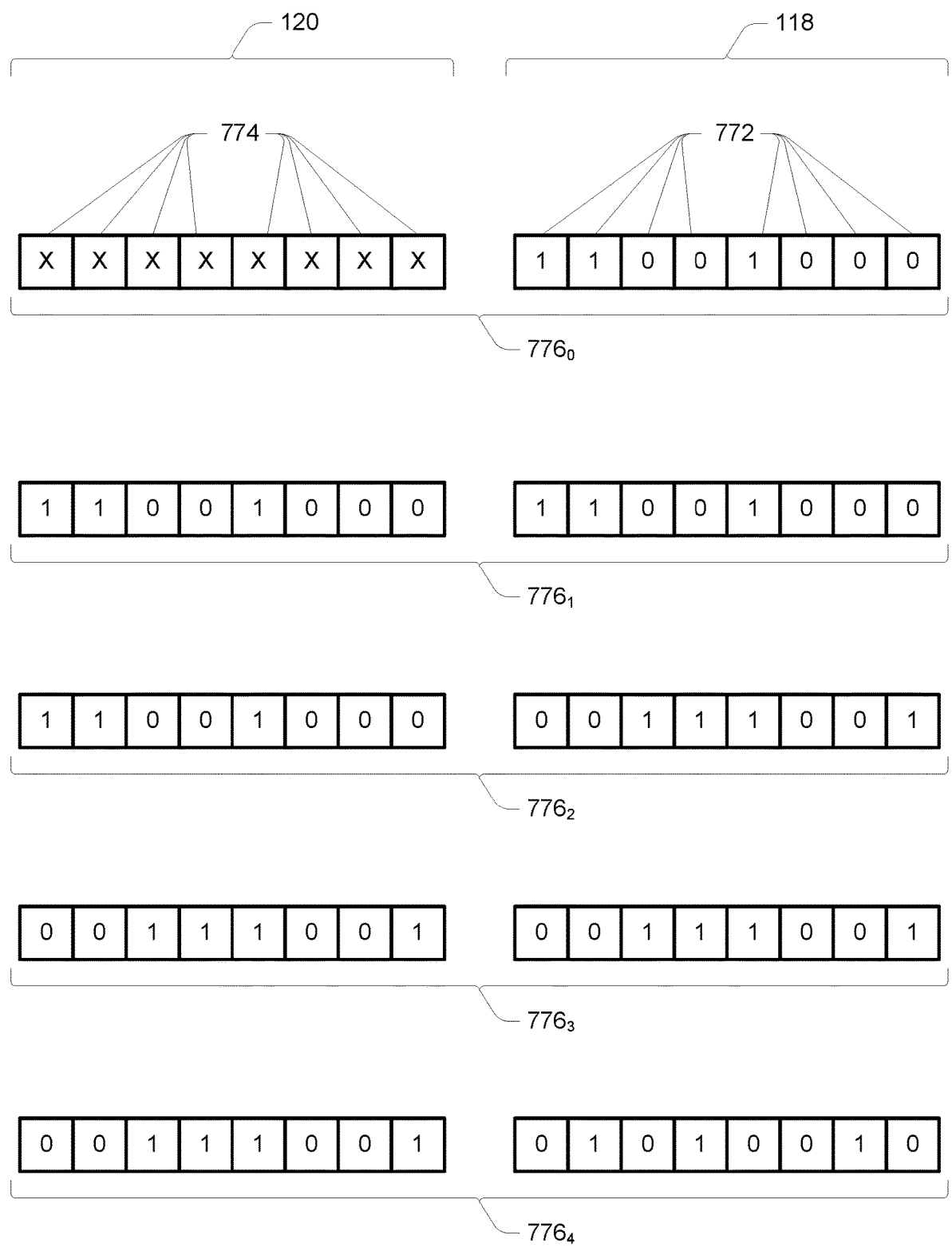
FIG. 7 is a depiction of an example of the interaction of a cache register and data register in accordance with an embodiment.

FIG. 7 is a depiction of an example of the interaction of a cache register 118 and data register 120 in accordance with an embodiment. In FIG. 7, the cache register 118 is depicted to contain eight storage registers 772 for storage of data by the memory for a programming operation, and the data register 120 is depicted to contain eight storage registers 774 for storage of data transferred from the cache register 118 for the programming operation. While it is recognized that a typical memory might contain significantly more storage registers 772 and storage registers 774, a simplified set of storage registers will be used to describe the interaction of the cache register 118 and the data register 120 during a programming operation.

At time $776_0$, the storage registers 772 of the cache register 118 might be loaded with data received in association with a write command. In the example of FIG. 7, this byte of data is represented as 11001000. While the data register 120 might contain data at this time, its values are irrelevant.

At time $776_1$, the data in the storage registers 772 of the cache register 118, e.g., 11001000, might be transferred to the storage registers 774 of the data register 120 such that the cache register 118 and the data register 120 contain the same data associated with the write command. The memory might then be able to program the data associated with the write command to the array of memory cells.

At time $776_2$, while the memory is programming the data of the data register 120 to the array of memory cells, the storage registers 772 of the cache register 118 might be loaded with data received in association with a subsequent write command. In the example of FIG. 7, this byte of data is represented as 00111001.

At time $776_3$, the data in the storage registers 772 of the cache register 118, e.g., 00111001, might be transferred to the storage registers 774 of the data register 120 such that the cache register 118 and the data register 120 contain the same data associated with the subsequent write command. The memory might then be able to program the data associated with the subsequent write command to the array of memory cells.

At time $776_4$, while the memory is programming the data of the data register 120 to the array of memory cells, the storage registers 772 of the cache register 118 might be loaded with data received in association with a further subsequent write command. In the example of FIG. 7, this byte of data is represented as 01010010. This process might be continued for additional received write commands. As subsequent write commands cannot be processed until data in the cache register 118 from a prior write command is transferred to the data register 120, it might be desirable to decrease the cache busy time $t_{CBSY}$.

Figure 8A:
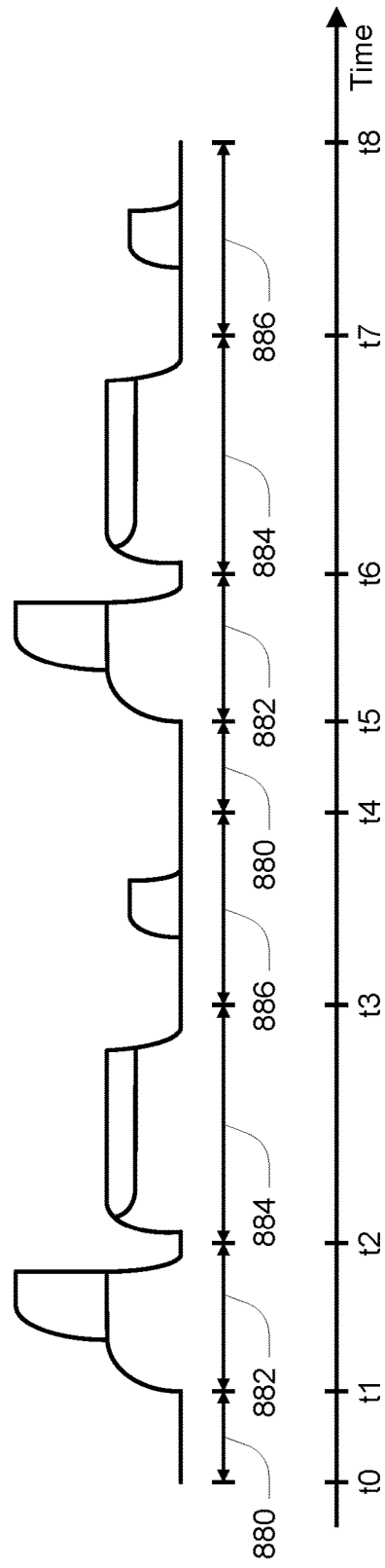
FIG. 8A is a simplified depiction of two successive array operations of the related art.

FIG. 8A is a simplified depiction of two successive array operations of the related art. FIG. 8A might depict two successive programming operations. FIG. 8A might depict a simplified representation of access line voltage levels, both selected and unselected access lines, during the programming operations.

Programming operations might include multiple phases. At time t0 of FIG. 8A, a prologue phase 880 of a first programming operation might begin. The prologue phase 880 might represent time to prepare the memory to program the data to the array of memory cells, e.g., starting from an initialization state. For example, the address data might be checked to determine which block of memory cells, and which row of memory cells of that block of memory cells, contains the memory cells selected for programming. The memory might further check to determine whether one or more of the memory cells selected for programming have been designated to be replaced by redundant memory cells, and, if so, to mask those addresses to select the redundant memory cells. The memory might check the temperature sensor to determine if any adjustments to trim values should be made, or if any notifications should be issued. The memory might further activate the voltage generation system associated with the selected block of memory cells, along with its associated voltage generation devices, and might activate other peripheral circuitry associated with accessing the selected block of memory cells.

At time t1 of FIG. 8A, a programming phase 882 of the first programming operation might begin. The programming phase 882 might represent time for effecting programming of the data to the array of memory cells. For example, a programming pulse might be applied to the access line connected to the memory cells selected for programming while pass voltages might be applied to remaining access lines of strings of series-connected memory cells containing the memory cells selected for programming.

At time t2 of FIG. 8A, a verify phase 884 of the first programming operation might begin. The verify phase 884 might represent time for determining whether the data has been successfully programmed to the selected memory cells. For example, a read voltage might be applied to the access line connected to the memory cells selected for programming while pass voltages might be applied to remaining access lines of strings of series-connected memory cells containing the selected memory cells. The access lines and select lines of the selected block of memory cells might subsequently be discharged, e.g., to a reference potential, which might be 0V, ground or Vss.

At time t3 of FIG. 8A, a recovery phase 886 of the first programming operation might begin. The recovery phase 886 might represent time for returning the block of memory cells to the initialization state. This might include deactivating the voltage generation system for the selected block of memory cells, including deactivating its voltage generation devices, which might further include discharging its voltage generation device, e.g., to the reference potential. The recovery phase 886 might further include biasing a subset of the access lines (e.g., drain-side access lines from a position of the selected memory cell) to a positive voltage level to remove trapped charge carriers from the channels of the strings of series-connected memory cells, and then discharging these access lines again, e.g., to the reference potential. Other peripheral circuitry involved in the access of the selected block of memory cells might also be deactivated. For example, block select transistors might be deactivated, as well as remaining circuitry of the column decode circuitry 110 and row decode circuitry 108.

At time t4 of FIG. 8A, a prologue phase 880 of a second programming operation might begin. The prologue phase 880 of the second programming operation might include all activity types of the prologue phase 880, albeit directed to a different set of selected memory cells corresponding to an address associated with a subsequent write command and to programming the data associated with the subsequent write command. In particular, the memory might be initiating the second programming operation from the initialization state. At time t5 of FIG. 8A, a programming phase 882 of the second programming operation might begin. At time t6 of FIG. 8A, a verify phase 884 of the second programming operation might begin. And at time t7 of FIG. 8A, a recovery phase 886 of the second programming operation might begin. The programming phase 882, verify phase 884 and recovery phase 886 of the second programming operation might include all activity types of the programming phase 882, verify phase 884 and recovery phase 886, respectively, of the first programming operation, albeit directed to a different set of selected memory cells corresponding to an address associated with the subsequent write command and to programming the data associated with the subsequent write command.

Figure 8B:
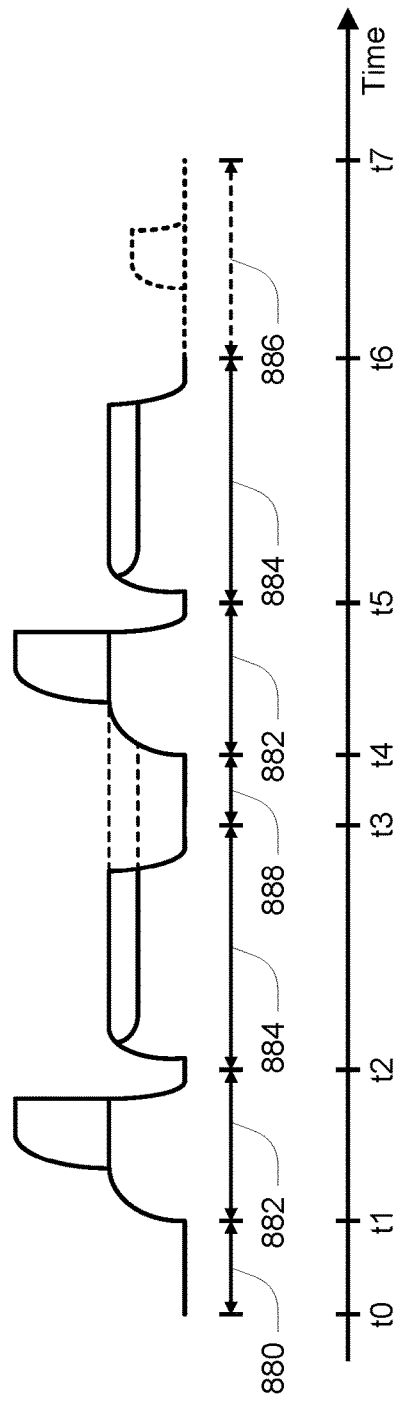
FIG. 8B is a simplified depiction of two successive array operations in accordance with an embodiment.

FIG. 8B is a simplified depiction of two successive array operations in accordance with an embodiment. FIG. 8B might depict two successive programming operations. FIG. 8B might depict a simplified representation of access line voltage levels, both selected and unselected access lines, during the programming operations.

Programming operations might include multiple phases. At time t0 of FIG. 8B, a prologue phase 880 of a first programming operation might begin. The prologue phase 880 might represent time to prepare the memory to program the data to the array of memory cells, e.g., starting from an initialization state. For example, the address data might be checked to determine which block of memory cells, and which row of memory cells of that block of memory cells, contains the memory cells selected for programming. The memory might further check to determine whether one or more of the memory cells selected for programming have been designated to be replaced by redundant memory cells, and, if so, to mask those addresses to select the redundant memory cells. The memory might check the temperature sensor to determine if any adjustments to trim values should be made, or if any notifications should be issued. The memory might further activate the voltage generation system associated with the selected block of memory cells, along with its associated voltage generation devices, and might activate other peripheral circuitry associated with accessing the selected block of memory cells.

At time t1 of FIG. 8B, a programming phase 882 of the first programming operation might begin. The programming phase 882 might represent time for effecting programming of the data to the array of memory cells. For example, a programming pulse might be applied to the access line connected to the memory cells selected for programming while pass voltages might be applied to remaining access lines of strings of series-connected memory cells containing the memory cells selected for programming.

At time t2 of FIG. 8B, a verify phase 884 of the first programming operation might begin. The verify phase 884 might represent time for determining whether the data has been successfully programmed to the selected memory cells. For example, a read voltage might be applied to the access line connected to the memory cells selected for programming while pass voltages might be applied to remaining access lines of strings of series-connected memory cells containing the selected memory cells. For some embodiments, the access lines and select lines of the selected block of memory cells might subsequently be discharged, e.g., to a reference potential, which might be 0V, ground or Vss. For other embodiments, the access lines and select lines of the selected block of memory cells might retain their voltage levels from a sensing portion of the verify phase 884, e.g., as depicted in dashed lines for the access lines of the selected block of memory cells.

In contrast (e.g., further contrast) to the related art, a recovery phase 886 may not be performed following the verify phase 884. Where the subsequent programming operation is directed to a same block of memory cells, these activities might be omitted or reduced. As such, at time t3, the block of memory cells might not be returned to the initialization state. The voltage generation system for the selected block of memory cells, as well as its voltage generation devices, might remain activated. A subset of access lines of the selected block of memory cells might not be biased to a positive voltage level from the reference potential prior to initiating a next programming phase 882. Peripheral circuitry involved in the access of the selected block of memory cells might also remain activated. For example, block select transistors might remain activated, as well as remaining circuitry of the row decode circuitry 108.

At time t4 of FIG. 8B, an abbreviated prologue phase 888 of a second programming operation might begin. Because the block of memory cells was not returned to the initialization state, certain activities of the prologue phase 880 might be omitted or reduced. For example, knowing that the second programming operation is directed to the same block of memory cells, the address data might not be checked (e.g., might not be checked again) to determine which block of memory cells contains the memory cells selected for programming. Where redundancy utilizes replacement columns of memory cells, the memory might not check to determine whether one or more of the memory cells selected for programming have been designated to be replaced by redundant memory cells as those addresses might already be masked to select the redundant memory cells. The memory might presume that it is subjected to the same temperature (e.g., ambient or device temperature) and thus might not check the temperature sensor. The voltage generation system associated with the selected block of memory cells, along with its associated voltage generation devices, might remain activated, and other peripheral circuitry associated with accessing the selected block of memory cells might also remain activated. With regard to the voltage generation system, the memory might merely change the multiplexing of the voltage generation devices in view of a different selected access line to receive the programming voltage, and different unselected access lines to receive a pass voltage.

At time t4 of FIG. 8B, a programming phase 882 of the second programming operation might begin. At time t5 of FIG. 8B, a verify phase 884 of the second programming operation might begin. The programming phase 882 and verify phase 884 of the second programming operation might include all activity types of the programming phase 882 and verify phase 884, respectively, of the first programming operation, albeit directed to a different set of selected memory cells corresponding to an address associated with the subsequent write command and to programming the data associated with the subsequent write command.

Where a next subsequent command is directed to a different block of memory cells, or to a different array operation, e.g., a read operation, at time t6, a recovery phase 886 of the second programming operation might begin. This recovery phase 886 of the second programming operation might include all activity types of the recovery phase 886 as described with reference to the first programming operation of FIG. 8A, albeit directed to a different set of selected memory cells. Alternatively, where the next subsequent command is a same array operation directed to the same block of memory cells, the memory could proceed to a next programming phase 882 at time t6 without performing a recovery phase 886.

Figure 9:
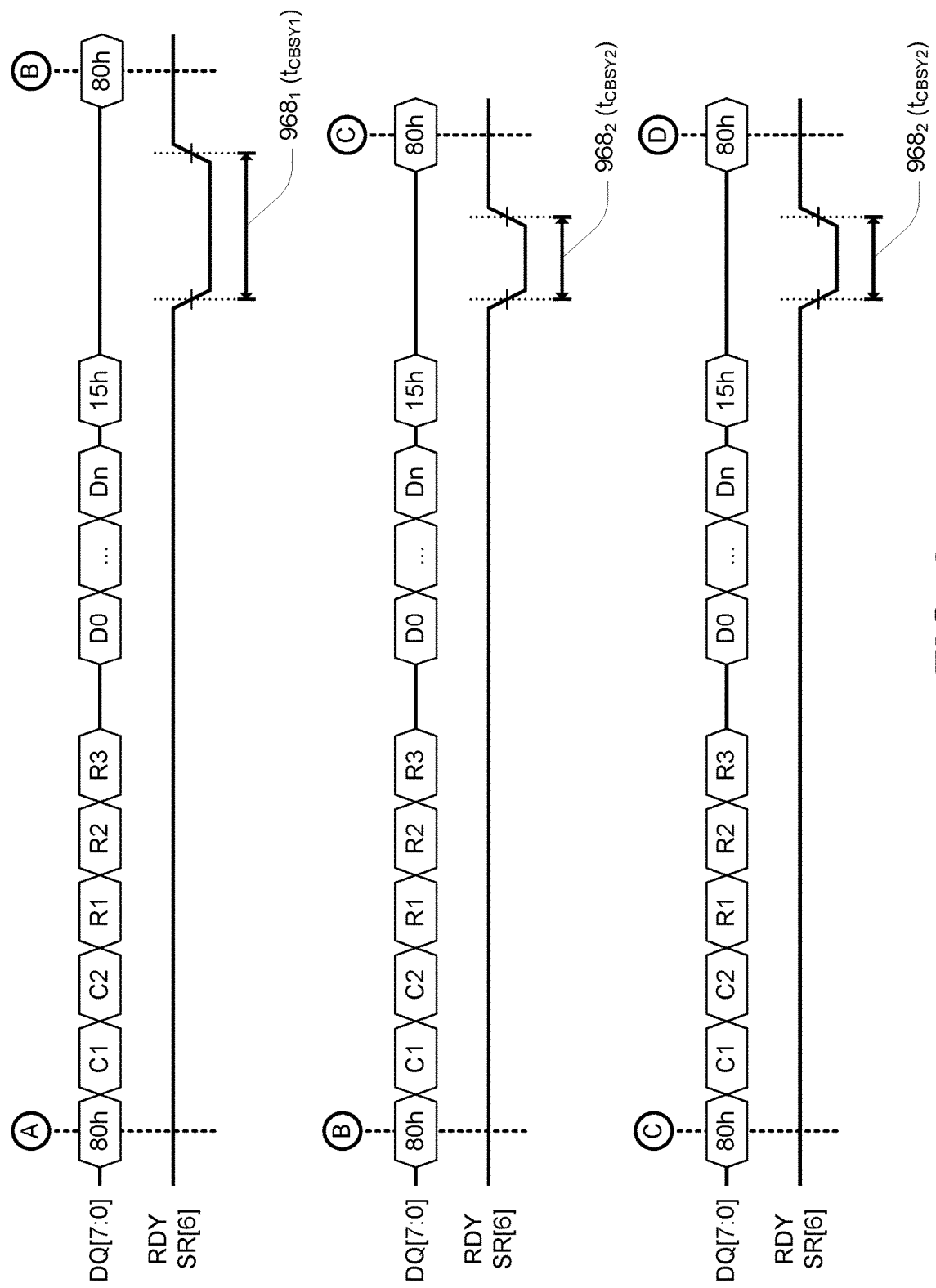
FIG. 9 is a timing diagram of successive commands to perform array operations in accordance with an embodiment.

FIG. 9 is a timing diagram of successive commands to perform array operations in accordance with an embodiment. The commands might represent cache program commands to perform a series of cache programming operations to a same block of memory cells. The elements of the commands might correspond to the description of FIG. 5. As such, at time A, a first cycle of a first command is received (e.g., by a controller of a memory), followed by its associated address and data, and the second cycle of the first command. The cache busy time (tCBSY$_1$) 968$_1$ might represent the time for a prologue phase 880, programming phase 882, and verify phase 884 as discussed with reference to FIG. 8B. Because the controller (e.g., control logic 116) has knowledge that a subsequent (e.g., second) command is queued to be processed at time B, and that it is for a same type of array operation directed to a same block of memory cells, the recovery phase 886 might be omitted. Due to the omission of the recovery phase 886, the cache busy time (tCBSY$_1$) 968$_1$ might be expected to be shorter in duration than a cache busy time of the related art for a same array operation.

At time B, a first cycle of the second command is received (e.g., by the controller), followed by its associated address and data, and the second cycle of the second command. The cache busy time (tCBSY$_2$) 968$_2$ might represent the time for an abbreviated prologue phase 888, programming phase 882, and verify phase 884 as discussed with reference to FIG. 8B. Because the controller (e.g., control logic 116) has knowledge that a subsequent (e.g., third) command is queued to be processed at time C, and that it is for a same type of array operation directed to a same block of memory cells, the recovery phase 886 might again be omitted. Due to the abbreviated prologue phase 888 made possible by not returning the block of memory cells and related access circuitry to an initialization state after programming the data associated with the first command, along with the common omission of the recovery phases 886, the cache busy time (tCBSY$_2$) 968$_2$ might be expected to be shorter in duration than the cache busy time (tCBSY$_1$) 968$_1$.

At time C, a first cycle of the third command is received (e.g., by the controller), followed by its associated address and data, and the second cycle of the third command. The third programming operation might again have the cache busy time (tCBSY$_2$) 968$_2$, e.g., in response to the controller (e.g., control logic 116) having knowledge that a subsequent (e.g., fourth) command is queued to be processed at time D, and that it is for a same type of array operation directed to a same block of memory cells. Alternatively, in response to the controller (e.g., control logic 116) having knowledge that either no subsequent command has been received (e.g., by the memory) and queued, or the subsequent command is for a different type of array operation and/or directed to a different block of memory cells, the controller might cause the memory to perform the abbreviated prologue phase 888, programming phase 882, verify phase 884, and recovery phase 886 to place the block of memory cells and related access circuitry to an initialization state, thus leading to a longer cache busy time.

Knowledge that a subsequent command is for a same array operation and directed to a same block of memory cells might include determining whether the command cycles indicate a same array operation, e.g., a programming operation, and whether an address associated with the subsequent command is directed to the same block of memory cells.

Figure 10A:
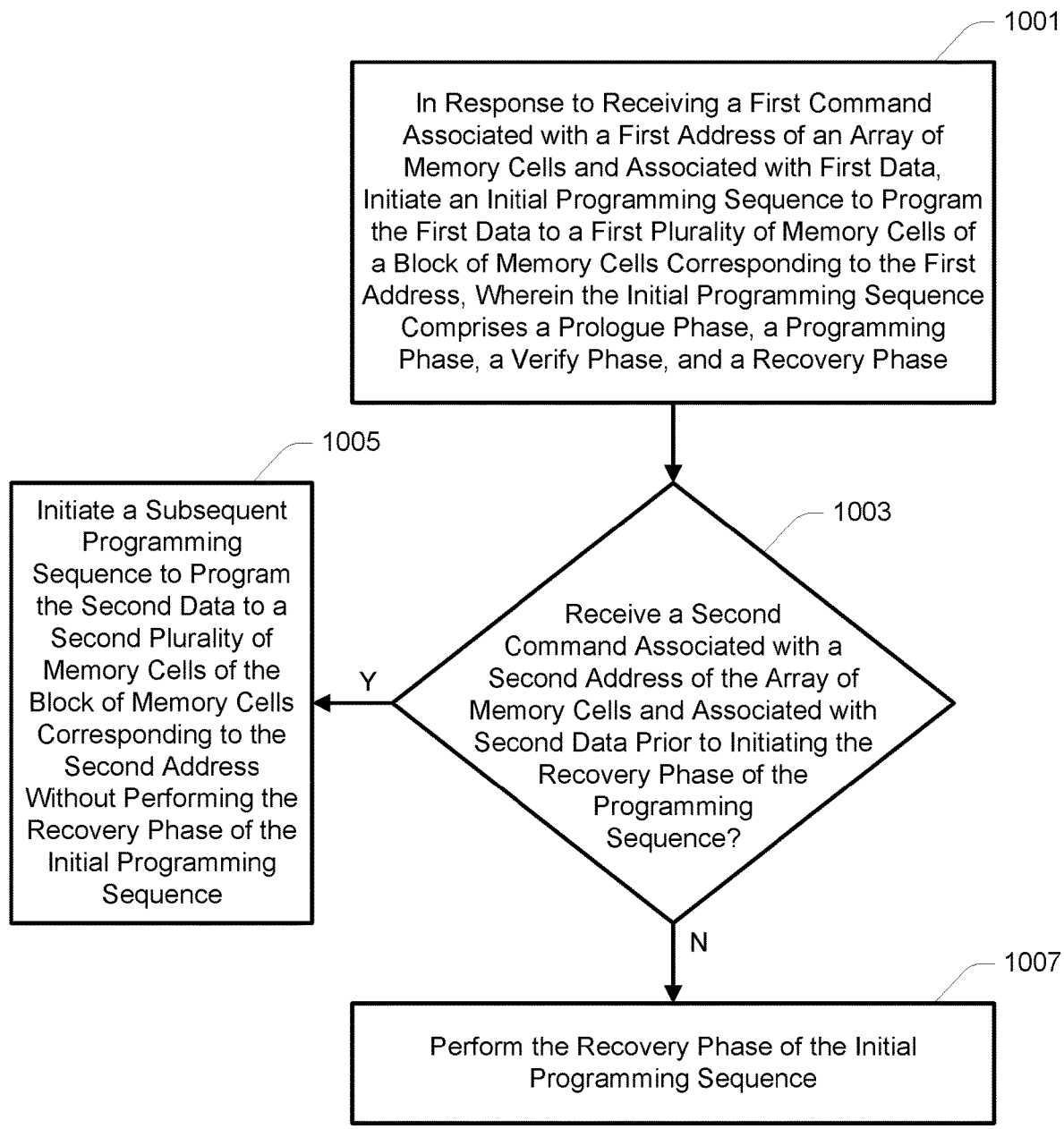
FIG. 10A is a flowchart of a method of operating a memory in accordance with an embodiment.

FIG. 10A is a flowchart of a method of operating a memory in accordance with an embodiment. The method might represent actions associated with successive array operations, e.g., programming operations, performed by the memory. The method might be in the form of computer-readable instructions, e.g., stored to the instruction registers 128. Such computer-readable instructions might be executed by a controller, e.g., the control logic 116, to cause the relevant components of the memory to perform the method.

At 1001, in response to receiving a first command associated with a first address of an array of memory cells and associated with first data, the memory might initiate an initial programming sequence to program the first data to a first plurality of memory cells of a block of memory cells of the array of memory cells corresponding to the first address. The initial programming sequence might include a prologue phase, a programming phase, a verify phase, and a recovery phase. The first command might be a write command for a programming operation. For example, the first command might be a cache program command. The first plurality of memory cells might correspond to a particular row (e.g., logical row) of the block of memory cells of the array of memory cells.

At 1003, it might be determined whether a second command associated with a second address of the array of memory cells and associated with second data has been received prior to performing the recovery phase of the initial programming sequence. The second command might be a write command for a programming operation. The second command might be for a same array operation (e.g., a same programming operation) as the first command, and the second address might correspond to a same block of memory cells of the array of memory cells as the first address. The second command might be received by the memory and placed in a command queue prior to processing by the controller.

At 1005, in response to the second command being received prior to initiating the recovery phase of the initial programming sequence, the memory might initiate a subsequent programming sequence to program the second data to a second plurality of memory cells of the block of memory cells corresponding to the second address without performing the recovery phase of the initial programming sequence. The second plurality of memory cells might correspond to a different row (e.g., logical row) of the block of memory cells. Alternatively, at 1007, in response to a second command not being received prior to initiating the recovery phase of the initial programming sequence, or a next command being directed to a different array operation and/or to a different block of memory cells, the memory might perform the recovery phase of the initial programming sequence.

Figure 10B:
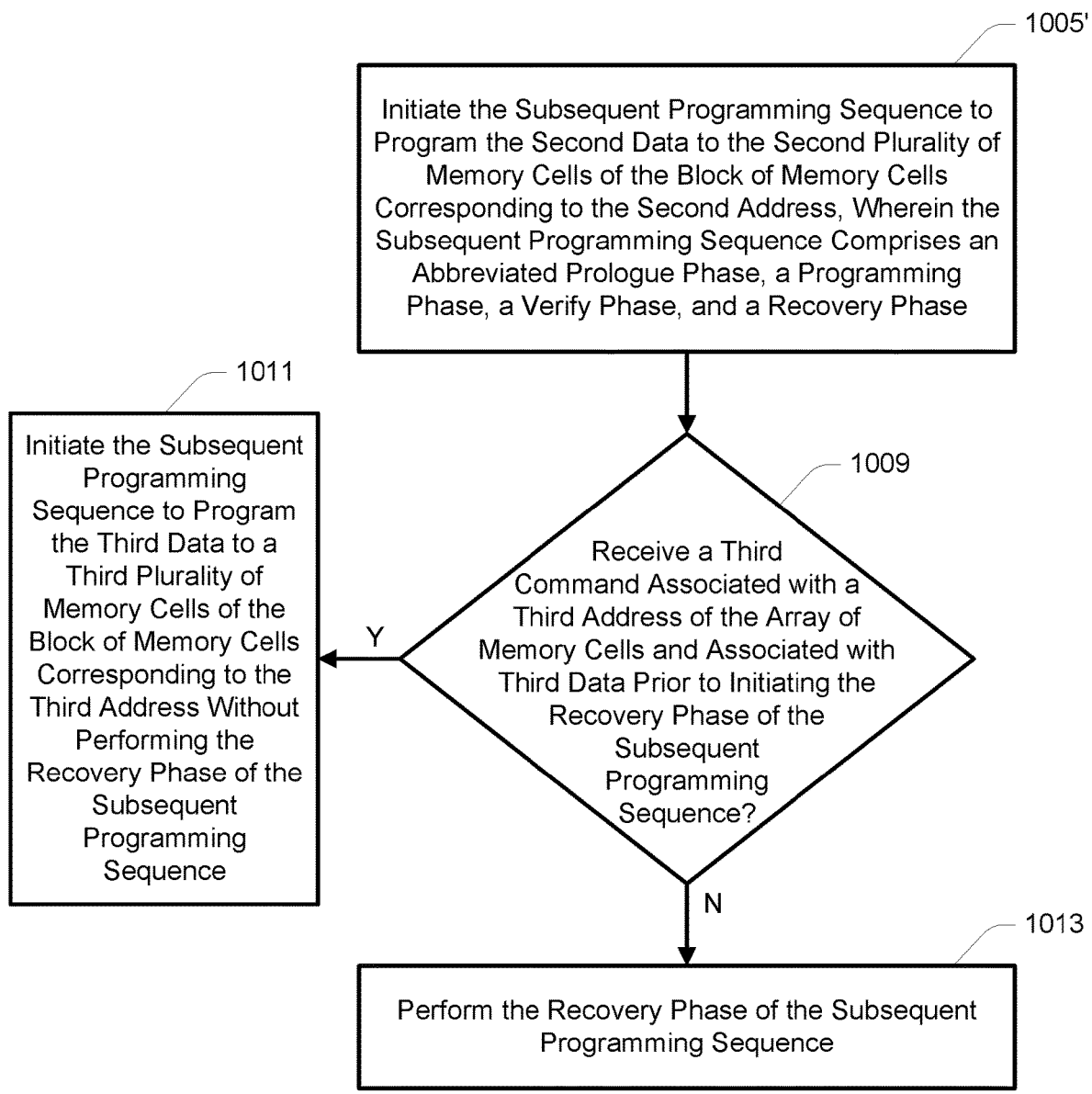
FIG. 10B is a flowchart of a method of operating a memory in accordance with another embodiment.

FIG. 10B is a flowchart of a method of operating a memory in accordance with another embodiment. The method might represent actions associated with successive array operations, e.g., programming operations, performed by the memory in continuation to the method of FIG. 10A. The method might be in the form of computer-readable instructions, e.g., stored to the instruction registers 128. Such computer-readable instructions might be executed by a controller, e.g., the control logic 116, to cause the relevant components of the memory to perform the method.

At 1005', which might represent an continuation of 1005 of FIG. 10A, the memory might initiate the subsequent programming sequence to program the second data to the second plurality of memory cells of the block of memory cells corresponding to the second address. The subsequent programming sequence might include an abbreviated prologue phase, a programming phase, a verify phase, and a recovery phase. The activity types of the abbreviated prologue phase of the subsequent programming sequence might be a proper subset of the activity types of the prologue phase of the initial programming sequence. That is, the abbreviated prologue phase of the subsequent programming sequence might contain only activity types performed by the prologue phase of the initial programming sequence, while the prologue phase of the initial programming sequence might contain additional activity types not performed by the abbreviated prologue phase of the subsequent programming sequence. The programming phase, verify phase and recovery phase (e.g., optional recovery phase) of the subsequent programming sequence might include all activity types (e.g., same activities albeit directed to different selected memory cells) of the programming phase, verify phase and recovery phase (e.g., optional recovery phase) of the initial programming sequence.

At 1009, it might be determined whether a third command associated with a third address of the array of memory cells and associated with third data has been received prior to initiating the recovery phase of the subsequent programming sequence. The third command might be a write command for a programming operation. The third command might be for a same array operation as the first command and the second command, and the third address might correspond to a same block of memory cells of the array of memory cells as the first address and the second address. The third command might be received by the memory and placed in a command queue prior to processing by the controller.

At 1011, in response to the third command being received prior to initiating the recovery phase of the subsequent programming sequence, the memory might initiate the subsequent programming sequence to program the third data to a third plurality of memory cells of the block of memory cells corresponding to the third address without performing the recovery phase of the subsequent programming sequence, e.g., subsequent to programming of the second data to the second plurality of memory cells. The third plurality of memory cells might correspond to a different row (e.g., logical row) of the block of memory cells. Alternatively, at 1013, in response to a third command not being received prior to initiating the recovery phase of the subsequent programming sequence, or the next command being directed to a different array operation and/or to a different block of memory cells, the memory might perform the recovery phase of the subsequent programming sequence. The process of 1005' to 1013 might be repeated for one or more additional commands for the same array operation and the same block of memory cells.

Figure 11A:
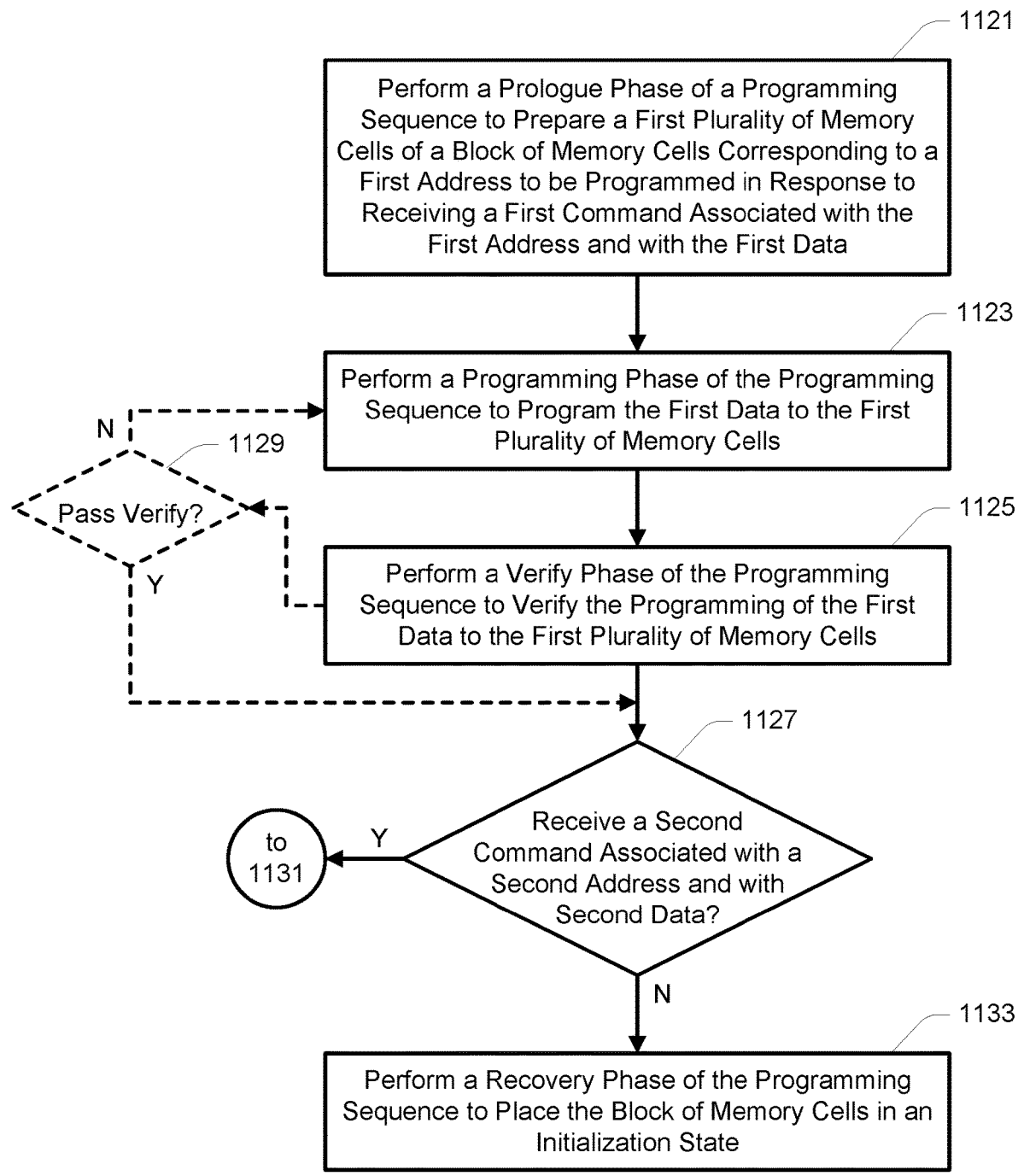
FIGS. 11A-11B are flowcharts of a method of operating a memory in accordance with a further embodiment.
Figure 11B:
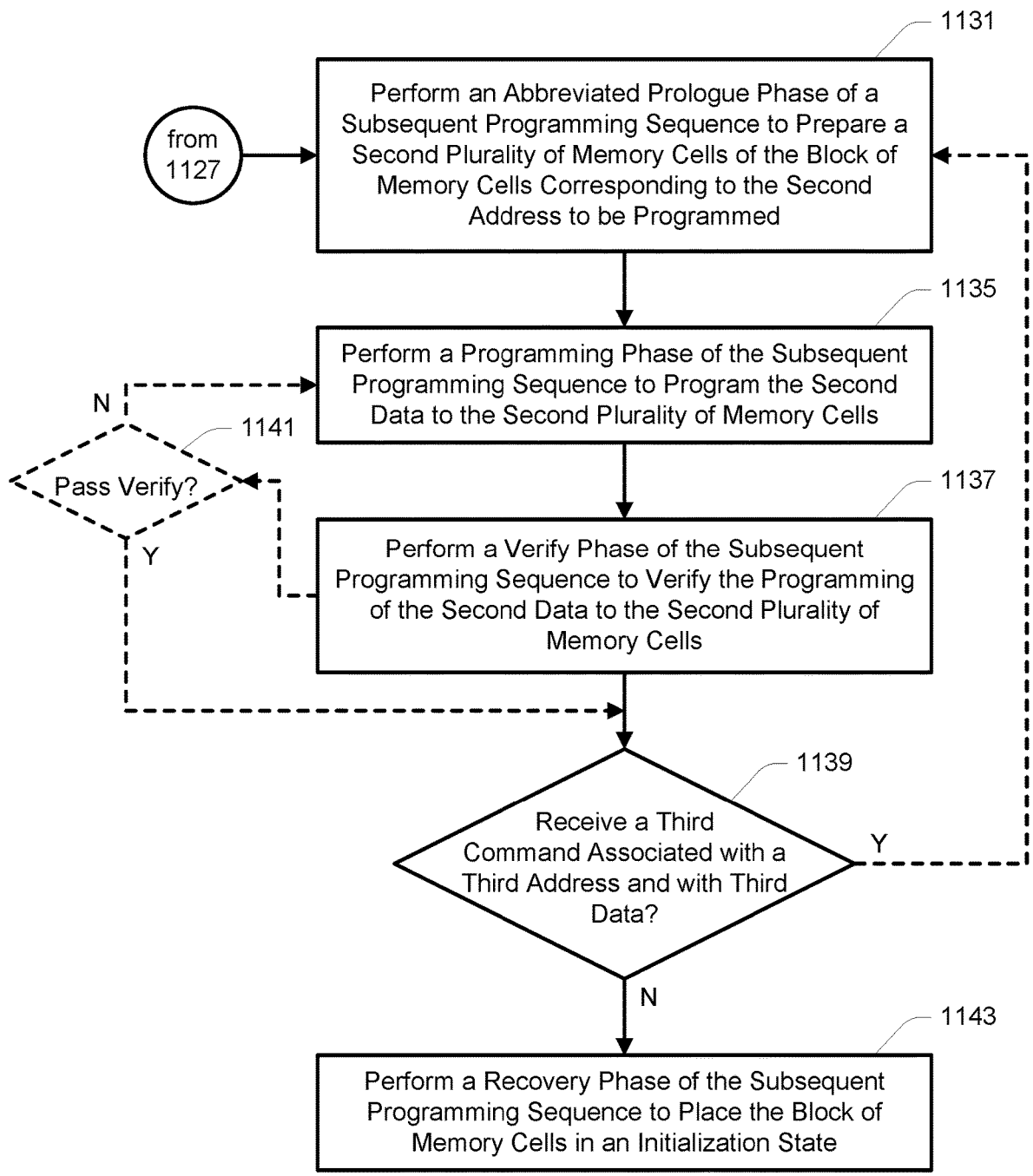

FIGS. 11A-11B are flowcharts of a method of operating a memory in accordance with a further embodiment. The method might represent actions associated with successive array operations, e.g., programming operations, performed by the memory. The method might be in the form of computer-readable instructions, e.g., stored to the instruction registers 128. Such computer-readable instructions might be executed by a controller, e.g., the control logic 116, to cause the relevant components of the memory to perform the method.

At 1121, in response to receiving a first command associated with a first address and with first data, a prologue phase of a programming sequence might be performed to prepare a first plurality of memory cells of a block of memory cells of an array of memory cells corresponding to the first address to be programmed. The first plurality of memory cells might be a page (e.g., logical page) of memory cells of the block of memory cells. The first command might be a write command to perform a programming operation. For example, the first command might be a cache program command.

At 1123, a programming phase of the programming sequence might be performed to program the first data to the first plurality of memory cells. At 1125, a verify phase of the programming sequence might be performed to verify whether the first data was successfully programmed to the first plurality of memory cells. The process might then continue to 1127 without further verification. Optionally, at 1129, it might be determined whether the verify phase passed, e.g., the first data was successfully programmed to the first plurality of memory cells. In response to determining that the verify phase passed, the process might proceed to 1127. In response to determining that the verify phase failed, e.g., the first data was not successfully programmed to the first plurality of memory cells, the process might return to 1123 to continue programming the first data to the first plurality of memory cells. This process of program/verify might repeat until determining that the verify phase passes, at which point the process could proceed to 1127.

At 1127, it might be determined whether a second command associated with a second address and with second data has been received. The second command might be a write command to perform a programming operation (e.g., a same programming operation) on a different plurality of memory cells. The second command might be a same command as the first command. For example, the first command might be a Page Cache Program command conforming to the ONFI 5.0 (Open NAND Flash Interface) standards specification, having a structure of an 80 h first cycle, and a 15 h second cycle. As such, the second command might also have the 80 h/15 h structure. Alternatively, ONFI 5.0 further provides a closing Page Cache Program command having a structure of an 80 h first cycle, and a 10 h second cycle, to indicate an end of the cache programming. Accordingly, the second command might be a different command than the first command, although it might still be directed to a same array operation and to a same block of memory cells.

The second command might be received by the memory and placed in a command queue prior to processing by the controller. The second address might correspond to the block of memory cells. In response to determining that the second command had been received at 1127, the process might proceed to 1131. Alternatively, at 1133, in response to a second command not being received, or the next command being directed to a different array operation and/or to a different block of memory cells, the memory might perform a recovery phase of the programming sequence to place the block of memory cells in an initialization state.

At 1131, an abbreviated prologue phase of a subsequent programming sequence might be performed to prepare a second plurality of memory cells of the block of memory cells corresponding to the second address to be programmed. The second plurality of memory cells might be a page (e.g., logical page) of memory cells of the block of memory cells.

At 1135, a programming phase of the subsequent programming sequence might be performed to program the second data to the second plurality of memory cells. At 1137, a verify phase of the subsequent programming sequence might be performed to verify whether the second data was successfully programmed to the second plurality of memory cells. The process might then continue to 1139 without further verification. Optionally, at 1141, it might be determined whether the verify phase passed, e.g., the second data was successfully programmed to the second plurality of memory cells. In response to determining that the verify phase passed, the process might proceed to 1139. In response to determining that the verify phase failed, e.g., the second data was not successfully programmed to the second plurality of memory cells, the process might return to 1135 to continue programming the second data to the second plurality of memory cells. This process of program/verify might repeat until determining that the verify phase passes, at which point the process could proceed to 1139.

At 1139, it might be determined whether a third command associated with a third address and with third data has been received. The third command might be a write command to perform a programming operation (e.g., a same programming operation) on a different plurality of memory cells. The third command might be a same command as the first command and the second command. The third command might be received by the memory and placed in a command queue prior to processing by the controller. The third address might correspond to the block of memory cells. In response to determining that the third command had been received at 1139, the process of 1131 through 1139 might be repeated, but for the third command and its associated third address and third data. Alternatively, at 1143, in response to a third command not being received, or a next command being directed to a different array operation and/or to a different block of memory cells, the memory might perform a recovery phase of the subsequent programming sequence to place the block of memory cells in an initialization state.

The activity types of the abbreviated prologue phase of the subsequent programming sequence might be a proper subset of the activity types of the prologue phase of the programming sequence (e.g., initial programming sequence). The programming phase, verify phase and recovery phase (e.g., optional recovery phase) of the subsequent programming sequence might include all activity types of the programming phase, verify phase and recovery phase (e.g., optional recovery phase) of the initial programming sequence.

Figure 12A:
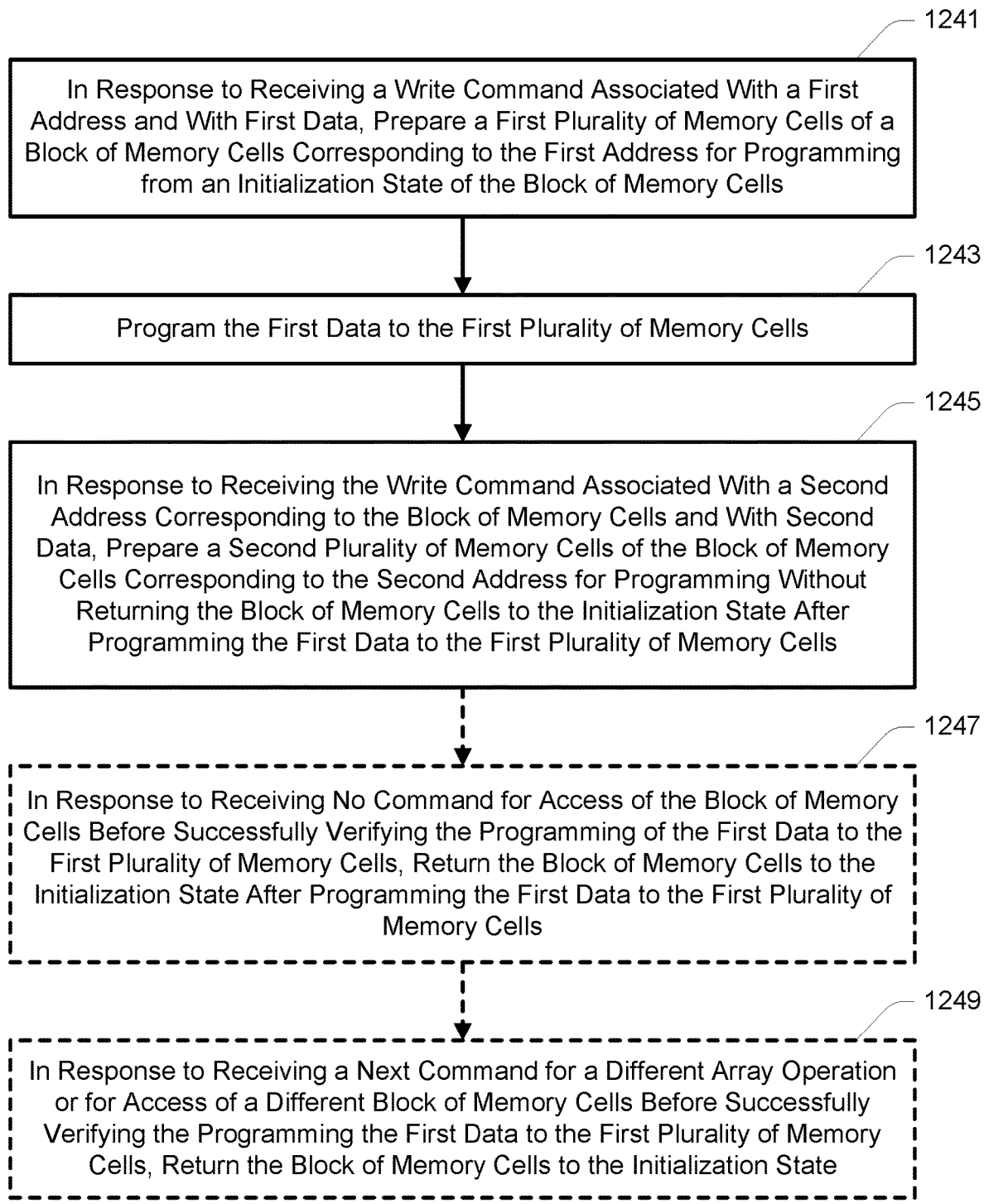
FIG. 12A is a flowchart of a method of operating a memory in accordance with a still further embodiment.

FIG. 12A is a flowchart of a method of operating a memory in accordance with a still further embodiment. The method might represent actions associated with successive array operations, e.g., programming operations, performed by the memory. The method might be in the form of computer-readable instructions, e.g., stored to the instruction registers 128. Such computer-readable instructions might be executed by a controller, e.g., the control logic 116, to cause the relevant components of the memory to perform the method.

At 1241, in response to receiving a write command associated with a first address and with first data, the memory might prepare a first plurality of memory cells of a block of memory cells for programming from an initialization state of the block of memory cells, as previously described. The first plurality of memory cells might correspond to the first address. The initialization state of the block of memory cells might include discharge of access lines and select lines of the block of memory cells to the reference potential, and deactivation of block select circuitry corresponding to the block of memory cells. The initialization state of the block of memory cells might further include deactivation of voltage generation devices corresponding to the block of memory cells. At 1243, the memory might program the first data to the first plurality of memory cells.

At 1245, in response to receiving the write command associated with a second address corresponding to the block of memory cells and with second data, e.g., before successfully verifying programming of the first data to the first plurality of memory cells, the memory might prepare a second plurality of memory cells of the block of memory cells for programming without returning the block of memory cells to the initialization state after programming the first data to the first plurality of memory cells. The second plurality of memory cells might correspond to the second address.

By not returning the block of memory cells to the initialization state after programming the first data to the first plurality of memory cells, the access lines and select lines might retain voltage levels nearer to their desired voltage levels for programming the second data than the reference potential. Similarly, by maintaining activation of the voltage generation devices corresponding to the block of memory cells, less time is required to bring them to their desired voltage levels. In addition, the block of memory cells might remain selected by maintaining activation of the block select circuitry. Each of these efficiencies, individually or in combination, can reduce the time necessary to program the second data to the second plurality of memory cells. In addition, by not expending the time to return the block of memory cells to the initialization state, the time necessary to program the first data to the first plurality of memory cells can also be reduced, thus permitting programming of the second data to the second plurality of memory cells to start sooner than if the block of memory cells had been returned to the initialization state.

Optionally, at 1247, in response to receiving no command for access of the block of memory cells before successfully verifying the programming of the first data to the first plurality of memory cells, the memory might return the block of memory cells to the initialization state after programming the first data to the first plurality of memory cells.

Optionally, at 1249, in response to receiving a next command for a different array operation or for access of a different block of memory cells before successfully verifying the programming of the first data to the first plurality of memory cells, the memory might return the block of memory cells to the initialization state after programming the first data to the first plurality of memory cells.

Figure 12B:
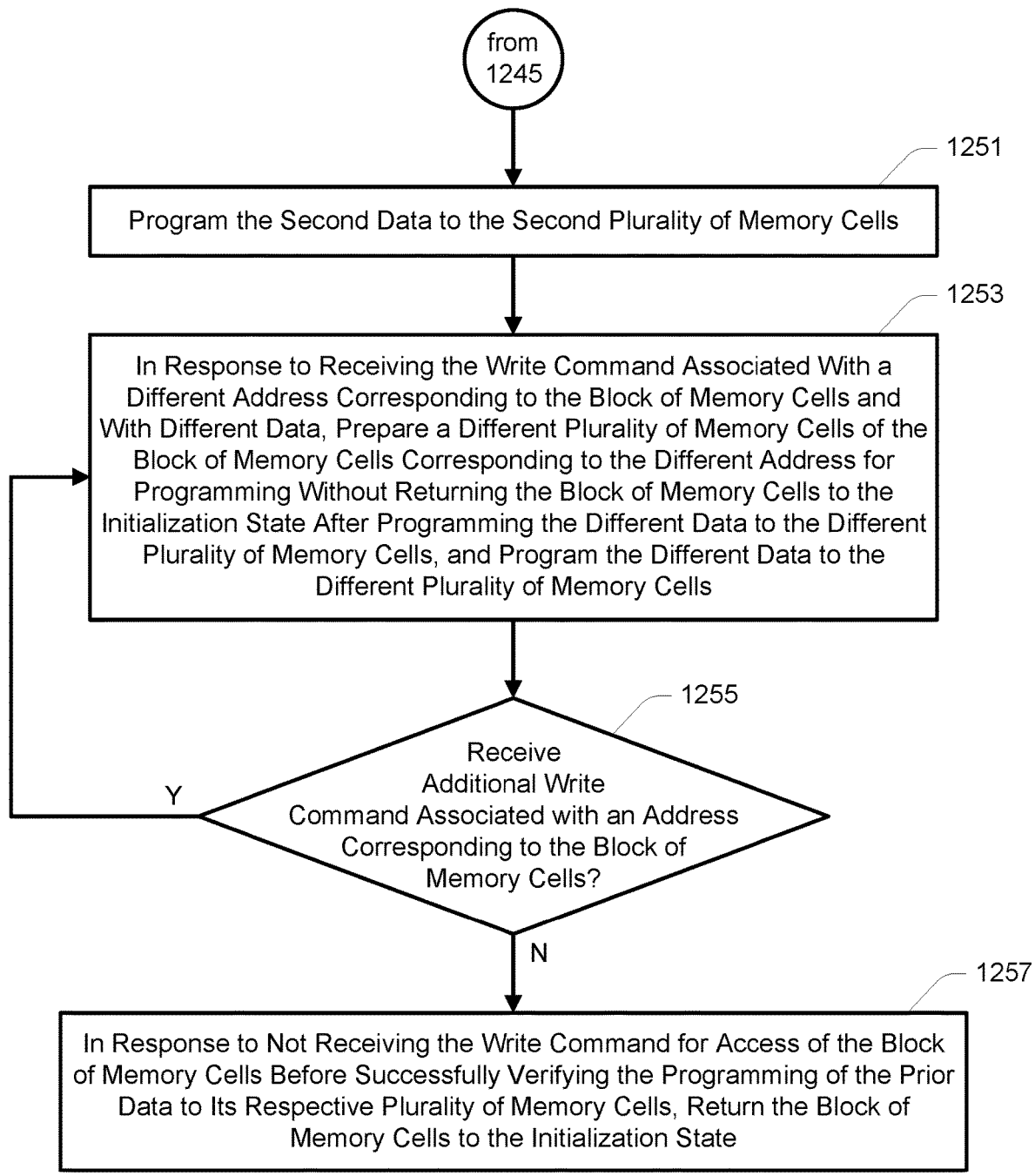
FIG. 12B is a flowchart of a method of operating a memory in accordance with a still further embodiment.

FIG. 12B is a flowchart of a method of operating a memory in accordance with a still further embodiment. The method might represent actions associated with successive array operations, e.g., programming operations, performed by the memory in continuation to the method of FIG. 12A. The method might be in the form of computer-readable instructions, e.g., stored to the instruction registers 128. Such computer-readable instructions might be executed by a controller, e.g., the control logic 116, to cause the relevant components of the memory to perform the method.

At 1251, continuing from 1245, the memory might program the second data to the second plurality of memory cells. At 1253, in response to receiving the write command associated with a different address corresponding to the block of memory cells and with different data, the memory might prepare a different plurality of memory cells of the block of memory cells for programming, and program the different data to the different plurality of memory cells, without returning the block of memory cells to the initialization state. The different plurality of memory cells might correspond to the different address.

At 1255, it might be determined whether an additional write command associated with an address corresponding to the block of memory cells has been received. If so, the process might return to 1253 to again prepare for programming of, and program, the data associated with the additional write command. This process of determining whether an additional write command associated with an address corresponding to the block of memory cells has been received, and subsequently preparing for programming of, and programming, the data associated with the additional write command, might be repeated for one or more additional received write commands for access of the block of memory cells. If such a write command is not received at 1255 before successfully verifying the programming of the data associated with the prior write command, the process might proceed to 1257 and return the block of memory cells to the initialization state.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:
   an array of memory cells; and
   a controller for access of the array of memory cells, wherein the controller is configured to cause the memory to:
      in response to receiving a write command associated with a first address and with first data, prepare a first plurality of memory cells of a block of memory cells corresponding to the first address for programming from an initialization state of the block of memory cells;
      program the first data to the first plurality of memory cells; and
      in response to receiving the write command associated with a second address corresponding to the block of memory cells and with second data before successfully verifying programming of the first data to the first plurality of memory cells, prepare a second plurality of memory cells of the block of memory cells corresponding to the second address for programming without returning the block of memory cells to the initialization state after programming the first data to the first plurality of memory cells.

2. The memory of claim 1, wherein the controller is further configured to cause the memory to:
   in response to receiving no command for access of the block of memory cells before successfully verifying programming of the first data to the first plurality of memory cells, return the block of memory cells to the initialization state after programming the first data to the first plurality of memory cells.

3. The memory of claim 1, wherein the controller is further configured to cause the memory to:
  in response to receiving a command for access of a different block of memory cells before successfully verifying programming of the first data to the first plurality of memory cells, return the block of memory cells to the initialization state after programming the first data to the first plurality of memory cells.

4. The memory of claim 1, wherein the controller being configured to cause the memory to return the block of memory cells to the initialization state comprises the controller being configured to deactivate block select circuitry corresponding to the block of memory cells.

5. The memory of claim 1, wherein the controller being configured to cause the memory to return the block of memory cells to the initialization state comprises the controller being configured to deactivate voltage generation devices corresponding to the block of memory cells.

6. The memory of claim 1, wherein the controller being configured to cause the memory to return the block of memory cells to the initialization state comprises the controller being configured to discharge access lines and select lines corresponding to the block of memory cells to a reference potential.

7. The memory of claim 1, wherein the controller is further configured to cause the memory to:
  program the second data to the second plurality of memory cells; and
  for each additional write command of one or more additional write commands, each associated with a respective address corresponding to the block of memory cells and with respective data, and each received before successfully verifying programming of any prior data to a respective plurality of memory cells:
    in response to receiving that additional write command, prepare a respective plurality of memory cells of the block of memory cells corresponding to its respective address for programming without returning the block of memory cells to the initialization state after programming the prior data to its respective plurality of memory cells; and
    program the respective data of that additional write command to its respective plurality of memory cells; and
  in response to not receiving an additional write command for access of the block of memory cells before successfully verifying the programming of the prior data to its respective plurality of memory cells, return the block of memory cells to the initialization state.

8. A memory, comprising:
  an array of memory cells; and
  a controller for access of the array of memory cells, wherein the controller is configured to cause the memory to:
    in response to receiving a first command associated with a first address of the array of memory cells and with first data, and corresponding to a programming operation, initiate an initial programming sequence to program the first data to a first plurality of memory cells of a block of memory cells of the array of memory cells corresponding to the first address, wherein the initial programming sequence comprises a prologue phase, a programming phase, a verify phase, and a recovery phase;
    determine whether a second command associated with a second address corresponding to the block of memory cells and associated with second data is received by the memory prior to initiating the recovery phase of the initial programming sequence, wherein the second address corresponds to a second plurality of memory cells of the block of memory cells, and wherein the second command corresponds to the programming operation; and
    in response to receiving the second command prior to initiating the recovery phase of the initial programming sequence, initiate a subsequent programming sequence to program the second data to a second plurality of memory cells of the block of memory cells corresponding to the second address without performing the recovery phase of the initial programming sequence.

9. The memory of claim 8, wherein the first command and the second command are a same command.

10. The memory of claim 8, wherein the controller is further configured to cause the memory to:
  perform the recovery phase of the initial programming sequence in response to not receiving the second command prior to initiating the recovery phase of the initial programming sequence.

11. The memory of claim 8, wherein the controller is further configured to cause the memory to:
  perform the recovery phase of the initial programming sequence in response to receiving a next command that is directed to a different array operation or directed to a different block of memory cells prior to initiating the recovery phase of the initial programming sequence.

12. The memory of claim 8, wherein the subsequent programming sequence comprises an abbreviated prologue phase, wherein the prologue phase of the initial programming sequence comprises activating voltage generation devices corresponding to the block of memory cells, and wherein the abbreviated prologue phase of the subsequent programming sequence does not comprise activating those voltage generation devices corresponding to the block of memory cells.

13. The memory of claim 12, wherein the prologue phase of the initial programming sequence comprises checking a temperature sensor, and wherein the abbreviated prologue phase of the subsequent programming sequence does not comprise checking the temperature sensor.

14. The memory of claim 12, wherein the prologue phase of the initial programming sequence comprises checking the first address to determine the block of memory cells, and wherein the abbreviated prologue phase of the subsequent programming sequence does not comprise checking the first address to determine the block of memory cells.

15. The memory of claim 12, wherein the prologue phase of the initial programming sequence comprises determining whether a memory cell selected for programming has been designated to be replaced by a redundant memory cell, and wherein the abbreviated prologue phase of the subsequent programming sequence does not comprise determining whether a memory cell selected for programming has been designated to be replaced by a redundant memory cell.

16. The memory of claim 8, wherein the subsequent programming sequence comprises a programming phase, a verify phase, and a recovery phase, and wherein the programming phase, the verify phase, and the recovery phase of the subsequent programming sequence each comprise a same set of activity types as the programming phase, the verify phase, and the recovery phase, respectively, of the initial programming sequence.

17. A memory, comprising:

an array of memory cells; and a controller for access of the array of memory cells, wherein the controller is configured to cause the memory to:

in response to receiving a first command associated with a first address of the array of memory cells and associated with first data, perform a prologue phase of a programming sequence to prepare a first plurality of memory cells of a block of memory cells of the array of memory cells corresponding to the first address to be programmed, wherein the first command corresponds to a programming operation;

perform a programming phase of the programming sequence to program the first data to the first plurality of memory cells;

perform a verify phase of the programming sequence to verify the programming of the first data to the first plurality of memory cells;

determine whether a second command associated with a second address corresponding to the block of memory cells and associated with second data is received by the memory, wherein the second address corresponds to a second plurality of memory cells of the block of memory cells, and wherein the second command corresponds to the programming operation;

in response to receiving the second command, perform an abbreviated prologue phase of a subsequent programming sequence to prepare the second plurality of memory cells of the block of memory cells to be programmed; and in response to not receiving the second command, perform a recovery phase of the programming sequence.

18. The memory of claim 17, wherein the second command is a same command as the first command.

19. The memory of claim 17, wherein the controller is further configured to cause the memory to repeat the programming phase and verify phase of the programming sequence in response to determining that the first data was not successfully programmed to the first plurality of memory cells.

20. The memory of claim 17, wherein, in response to receiving the second command, the controller is further configured to cause the memory to:

perform a programming phase of the subsequent programming sequence to program the second data to the second plurality of memory cells;

perform a verify phase of the subsequent programming sequence to verify the programming of the second data to the second plurality of memory cells;

determine whether a third command associated with a third address corresponding to the block of memory cells and associated with third data is received by the memory, wherein the third address corresponds to a third plurality of memory cells of the block of memory cells, and wherein the third command corresponds to the programming operation;

in response to receiving the third command, perform the abbreviated prologue phase of the subsequent programming sequence to prepare the third plurality of memory cells to be programmed; and in response to not receiving the third command, perform a recovery phase of the subsequent programming sequence.

21. The memory of claim 20, wherein the second command is a same command as the first command, and wherein the third command is a different command than the second command.

22. The memory of claim 17, wherein a set of activity types of the abbreviated prologue phase of the subsequent programming sequence is a proper subset of a set of activity types of the prologue phase of the programming sequence.

* * * * *